US011948857B2

(12) United States Patent
Ho

(10) Patent No.: US 11,948,857 B2
(45) Date of Patent: Apr. 2, 2024

(54) SEMICONDUCTOR DEVICE WITH THERMAL RELEASE LAYER AND METHOD FOR FABRICATING THE SAME

(71) Applicant: NANYA TECHNOLOGY CORPORATION, New Taipei (TW)

(72) Inventor: Jar-Ming Ho, Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 224 days.

(21) Appl. No.: 17/685,544

(22) Filed: Mar. 3, 2022

(65) Prior Publication Data

US 2022/0189847 A1   Jun. 16, 2022

Related U.S. Application Data

(62) Division of application No. 17/100,330, filed on Nov. 20, 2020, now Pat. No. 11,495,516.

(51) Int. Cl.
*H01L 23/373*   (2006.01)
*H01L 21/02*   (2006.01)
*H01L 23/00*   (2006.01)

(52) U.S. Cl.
CPC .... *H01L 23/3733* (2013.01); *H01L 21/02063* (2013.01); *H01L 24/03* (2013.01); *H01L 24/05* (2013.01); *H01L 2224/02311* (2013.01); *H01L 2224/02313* (2013.01); *H01L 2224/02331* (2013.01); *H01L 2224/02375* (2013.01); *H01L 2224/02381* (2013.01); *H01L 2224/0239* (2013.01); *H01L 2224/05082* (2013.01); *H01L 2224/05155* (2013.01); *H01L 2224/05157* (2013.01); *H01L 2224/05164* (2013.01)

(58) Field of Classification Search
CPC ............... H01L 23/3733; H01L 21/02063; H01L 24/05
See application file for complete search history.

(56) References Cited

U.S. PATENT DOCUMENTS 9,761,548 B1 *   9/2017   Irsigler ................ H01L 24/03
2007/0116957 A1 *   5/2007   Pan ........................ C23C 14/18
428/408

(Continued)

OTHER PUBLICATIONS

Office Action dated May 16, 2022 related to U.S. Appl. No. 17/100,330 wherein this application is a Div of U.S. Appl. No. 17/100,330.

(Continued)

*Primary Examiner* — Dale E Page
*Assistant Examiner* — Wilner Jean Baptiste
(74) *Attorney, Agent, or Firm* — Xuan Zhang

(57) ABSTRACT

The present application discloses a method for fabricating a semiconductor device. The method includes providing a substrate, forming a first pad above the substrate, forming a first redistribution conductive layer on the first pad, and forming a first redistribution thermal release layer on the first redistribution conductive layer. The first redistribution conductive layer and the first redistribution thermal release layer together form a first redistribution structure and the first redistribution thermal release layer is configured to sustain a thermal resistance between about 0.04° C. cm$^2$/Watt and about 0.25° C. cm$^2$/Watt.

14 Claims, 27 Drawing Sheets

(56) References Cited

U.S. PATENT DOCUMENTS

2011/0266680 A1 11/2011 Lin et al.
2012/0181688 A1* 7/2012 Hsu ...................... H05K 3/3473
   257/737
2015/0287671 A1* 10/2015 Chen ................... H01L 21/4853
   257/692
2016/0276827 A1 9/2016 Coyne

OTHER PUBLICATIONS

Office Action dated Jun. 22, 2022 related to Taiwanese Application No. 110128082.
Summary translation of Office Action dated Jun. 22, 2022 related to Taiwanese Application No. 110128082.

* cited by examiner

SEMICONDUCTOR DEVICE WITH THERMAL RELEASE LAYER AND METHOD FOR FABRICATING THE SAME

CROSS-REFERENCE TO RELATED APPLICATION

This application is a divisional application of U.S. Non-Provisional application Ser. No. 17/100,330 filed Nov. 20, 2020, which is incorporated herein by reference in its entirety.

TECHNICAL FIELD

The present disclosure relates to a semiconductor device and a method for fabricating the semiconductor device, and more particularly, to a semiconductor device with a thermal release layer and a method for fabricating the semiconductor device with the thermal release layer.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a substrate, a first pad positioned above the substrate, and a first redistribution structure including a first redistribution conductive layer positioned on the first pad and a first redistribution thermal release layer positioned on the first redistribution conductive layer. The first redistribution thermal release layer is configured to sustain a thermal resistance between about 0.04° C. $cm^2$/Watt and about 0.25° C. $cm^2$/Watt.

In some embodiments, the first redistribution thermal release layer includes an organic material interstitially mingled with carbon nanotubes.

In some embodiments, the first redistribution thermal release layer includes a fluoropolymer material interstitially mingled with carbon nanotubes.

In some embodiments, an aspect ratio of the carbon nanotubes is between about 1:1 and about 1:100.

In some embodiments, the first redistribution conductive layer is formed of tungsten, titanium, tin, nickel, copper, gold, aluminum, platinum, cobalt, or a combination thereof.

In some embodiments, the first redistribution conductive layer includes a seed layer positioned on the first pad and a plating layer positioned between the first redistribution thermal release layer and the seed layer.

In some embodiments, the semiconductor device includes a barrier layer positioned between the first pad and the first redistribution conductive layer.

In some embodiments, a thickness of the barrier layer is between about 10 angstroms and about 15 angstroms.

In some embodiments, the barrier layer is formed of titanium, titanium nitride, titanium silicon nitride, tantalum, tantalum nitride, tantalum silicon nitride, or a combination thereof.

In some embodiments, the semiconductor device includes an adjustment layer positioned between the barrier layer and the first redistribution conductive layer, wherein the adjustment layer is formed of a material including $sp^2$ hybridized carbon atoms.

In some embodiments, the adjustment layer is formed of graphene or graphite.

In some embodiments, the first pad includes a bottom portion positioned above the substrate and a top portion positioned on the bottom portion, the bottom portion includes nickel, and the top portion includes palladium, cobalt, or a combination thereof.

In some embodiments, the semiconductor device includes a second pad positioned above the substrate and a second redistribution structure. The second redistribution structure includes a second redistribution conductive layer positioned on the second pad and a second redistribution thermal release layer positioned on the second redistribution conductive layer, and the second redistribution thermal release layer is configured to sustain a thermal resistance between about 0.04° C. $cm^2$/Watt and about 0.25° C. $cm^2$/Watt.

Another aspect of the present disclosure provides a method for fabricating a semiconductor device including providing a substrate, forming a first pad above the substrate, forming a first redistribution conductive layer on the first pad, and forming a first redistribution thermal release layer on the first redistribution conductive layer. The first redistribution conductive layer and the first redistribution thermal release layer together form a first redistribution structure and the first redistribution thermal release layer is configured to sustain a thermal resistance between about 0.04° C. $cm^2$/Watt and about 0.25° C. $cm^2$/Watt.

In some embodiments, the first redistribution thermal release layer includes an organic material interstitially mingled with carbon nanotubes.

In some embodiments, the first redistribution thermal release layer includes a fluoropolymer material interstitially mingled with carbon nanotubes.

In some embodiments, the first redistribution conductive layer is formed of tungsten, titanium, tin, nickel, copper, gold, aluminum, platinum, cobalt, or a combination thereof.

In some embodiments, the step of forming the first pad includes: forming a bottom passivation layer above the substrate, forming a pad opening along the bottom passivation layer, and forming the first pad in the pad opening.

In some embodiments, the method for fabricating the semiconductor device includes a step of performing a cleaning process and a passivation process to the pad opening before the step of forming the first pad in the pad opening, wherein a process temperature of the cleaning process is between about 250° C. and about 350° C.

In some embodiments, a precursor of the passivation process is dimethylaminotrimethylsilane or tetramethylsilane.

Due to the design of the semiconductor device of the present disclosure, the first redistribution thermal release layer and the second redistribution thermal release layer may improve the thermal dissipation ability of the semiconductor device. As a result, the performance and the reliability of the semiconductor device may be improved. In addition, power consumption for the semiconductor device may be decreased due to the presence of the adjustment layer.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
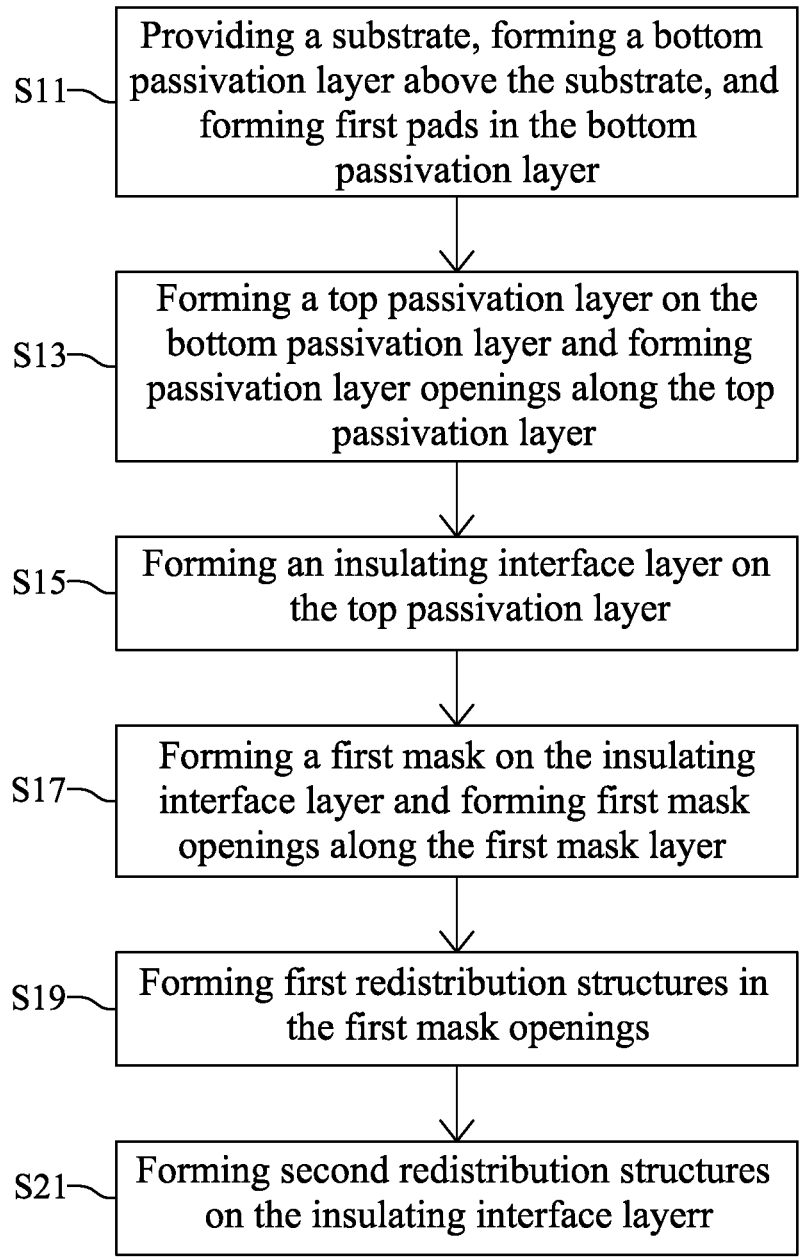
FIG. 1 illustrates, in a flowchart diagram form, a method for fabricating a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

Figure 2:
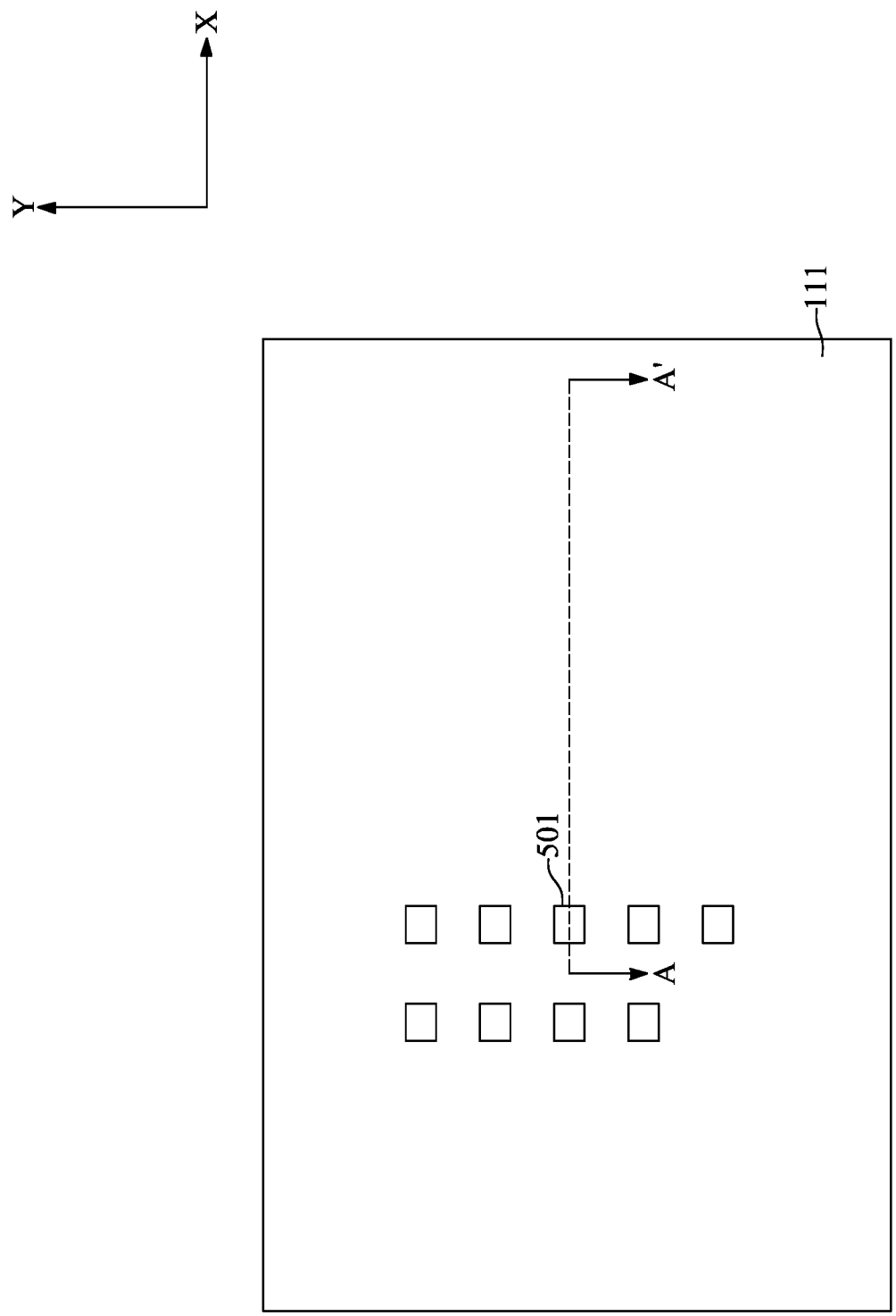
FIG. 2 illustrates, in a schematic top-view diagram, an intermediate semiconductor device in accordance with one embodiment of the present disclosure.
Figure 3:
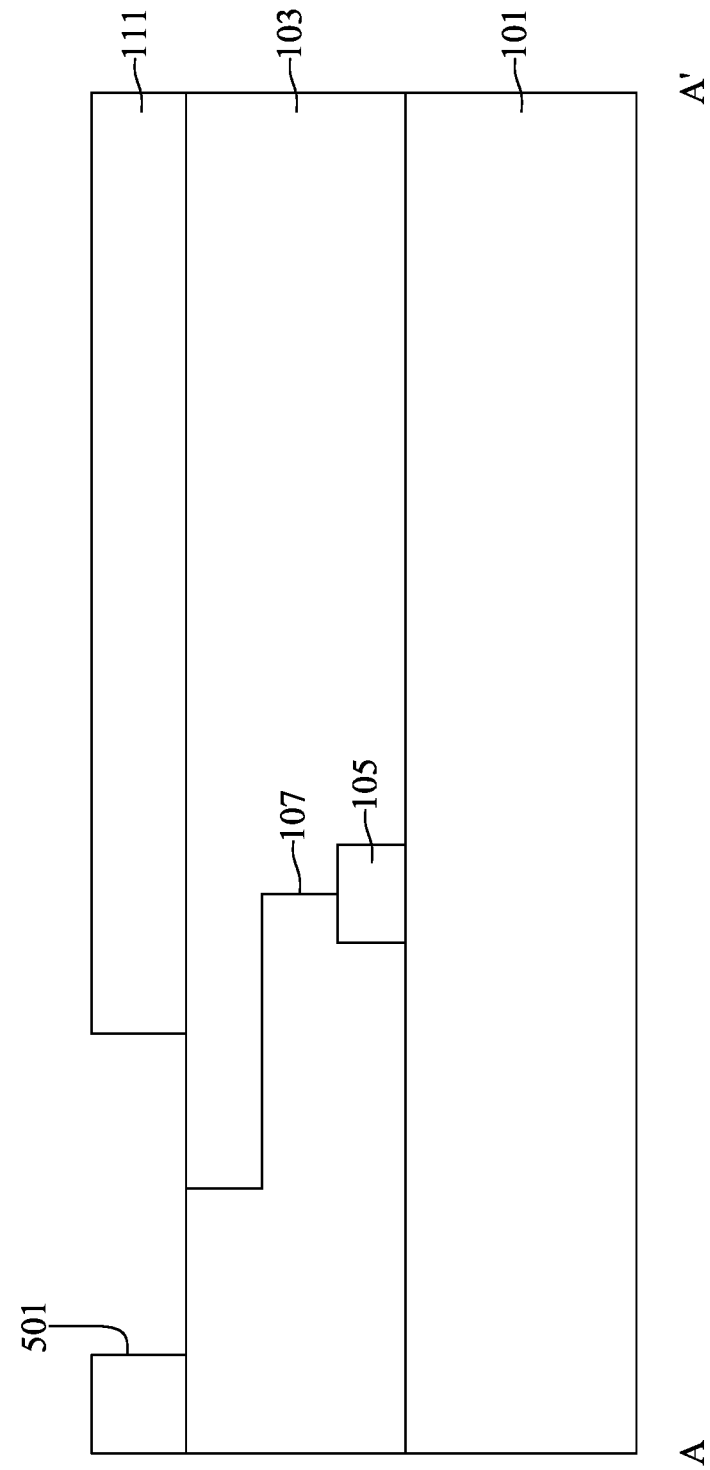
FIGS. 3 and 4 are schematic cross-sectional view diagrams taken along the line A-A' in FIG. 2 illustrating part of a flow for fabricating the semiconductor device in accordance with one embodiment of the present disclosure.
Figure 4:
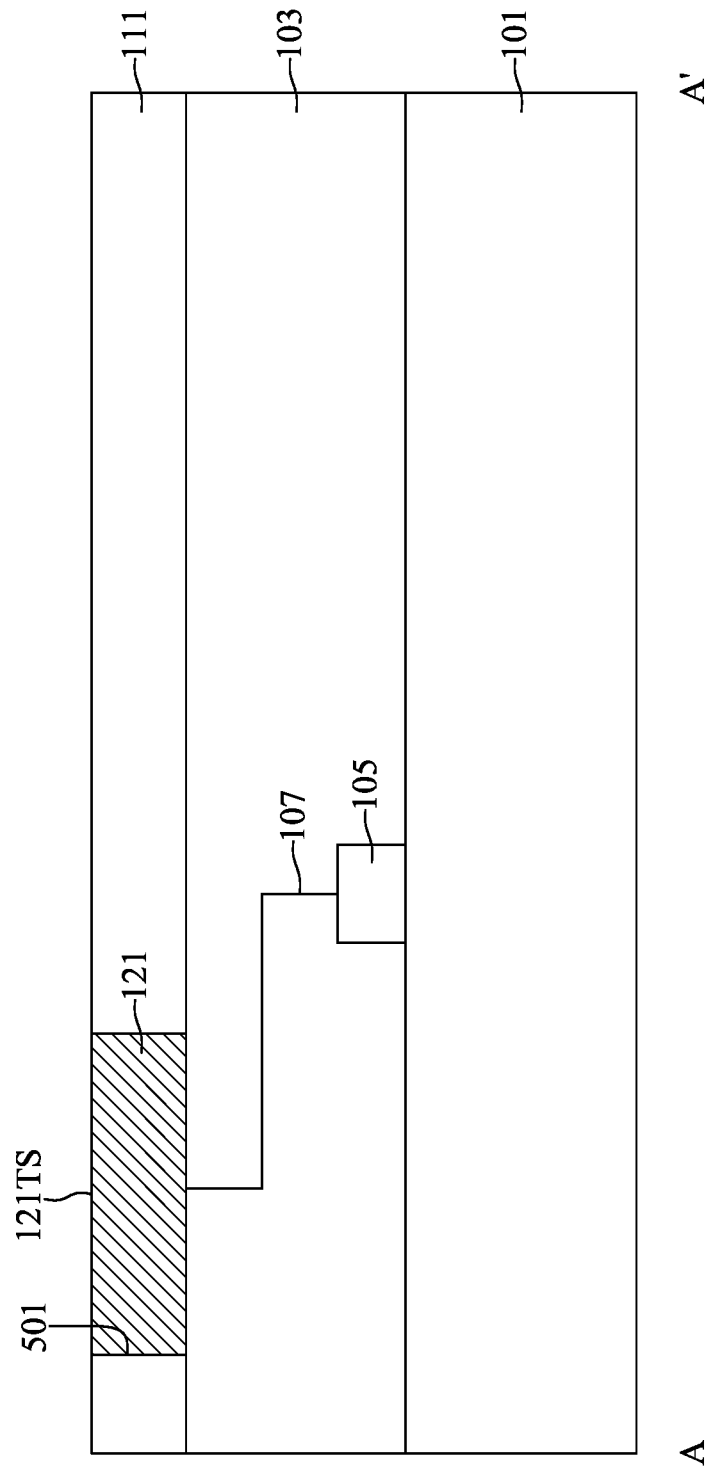

FIG. 1 illustrates, in a flowchart diagram form, a method 10 for fabricating a semiconductor device 1A in accordance with one embodiment of the present disclosure. FIG. 2 illustrates, in a schematic top-view diagram, an intermediate semiconductor device in accordance with one embodiment of the present disclosure. FIGS. 3 and 4 are schematic cross-sectional view diagrams taken along the line A-A' in FIG. 2 illustrating part of a flow for fabricating the semiconductor device 1A in accordance with one embodiment of the present disclosure.

With reference to FIGS. 1 to 4, at step S11, a substrate 101 may be provided, a bottom passivation layer 111 may be formed above the substrate 101, and first pads 121 may be formed in the bottom passivation layer 111.

With reference to FIGS. 2 and 3, the substrate 101 may be a bulk semiconductor substrate. The bulk semiconductor substrate may be formed of, for example, an elementary semiconductor such as silicon or germanium, or a compound semiconductor such as silicon germanium, silicon carbide, gallium arsenide, gallium phosphide, indium phosphide, indium arsenide, indium antimonide, or other III-V compound semiconductor or II-VI compound semiconductor.

In some embodiments, the substrate 101 may include a semiconductor-on-insulator structure which consisting of, from bottom to top, a handle substrate, an insulator layer, and a topmost semiconductor material layer. The handle substrate and the topmost semiconductor material layer may be formed of a same material as the bulk semiconductor substrate aforementioned. The insulator layer may be a crystalline or non-crystalline dielectric material such as an oxide and/or nitride. The insulator layer may have a thickness between about 10 nm and about 200 nm.

It should be noted that, the term "about" modifying the quantity of an ingredient, component, or reactant of the present disclosure refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. In yet another aspect, the term "about" means within 10, 9, 8, 7, 6, 5, 4, 3, 2, or 1% of the reported numerical value.

With reference to FIGS. 2 and 3, the interconnection layer 103 may be formed on the substrate 101. The interconnection layer 103 may include dielectrics or insulating layers formed on the bulk semiconductor substrate or the topmost semiconductor material layer. The dielectrics or the insulating layers may include, for example, a semiconductor oxide, a semiconductor nitride, semiconductor oxynitride, a semiconductor carbide, tetraethyl orthosilicate oxide, phosphosilicate glass, borophosphosilicate glass, fluorinated silica glass, carbon doped silicon oxide, amorphous fluorinated carbon, parylene, or combinations thereof.

With reference to FIGS. 2 and 3, device elements 105 (only shown one in FIG. 3 for clarity) may be formed in the substrate 101. The device elements 105 may be, for example, bipolar junction transistors, metal-oxide-semiconductor field effect transistors, diodes, system large-scale integration, flash memories, dynamic random-access memories, static random-access memories, electrically erasable programmable read-only memories, image sensors, micro-electro-mechanical system, active devices, or passive devices. The device elements 105 may be electrically isolated or insulated from neighboring device elements by insulating structures such as shallow trench isolation.

With reference to FIGS. 2 and 3, a first conductive pattern 107 may be formed in the interconnection layer 103 and electrically coupled to one of the device elements 105. The first conductive pattern 107 may include a plurality of conductive lines and a plurality of conductive vias which are electrically connected. The first conductive pattern 107 may be formed of, for example, copper, aluminum, titanium, tungsten, the like, or a combination thereof. The interconnection layer 103 may act as an insulator that supports and electrically isolates or insulates the first conductive pattern 107.

With reference to FIGS. 2 and 3, the bottom passivation layer 111 may be formed on the interconnection layer 103. The bottom passivation layer 111 may be formed of, for example, silicon oxide or phosphosilicate glass. The bottom passivation layer 111 may serve as a stress buffer between the interconnection layer 103 and a top passivation layer 113 as will be illustrated later. Alternatively, in some embodiments, the bottom passivation layer 111 may be formed of, for example, silicon oxide, silicon nitride, silicon oxynitride, silicon oxide nitride, polyimide, polybenzoxazole, phosphosilicate glass, undoped silica glass, or fluoride silicate glass.

With reference to FIGS. 2 and 3, the pad openings 501 may be formed along the bottom passivation layer 111. For convenience of description, only one pad opening 501 is described. The pad opening 501 may be formed by a photolithography process and a subsequent etch process. A portion of the top surface of the topmost conductive line of the first conductive pattern 107 may be exposed through the pad opening 501.

In some embodiments, a cleaning process and a passivation process may be performed on the intermediate semiconductor device illustrated in FIGS. 2 and 3 to passivate the sidewalls of the bottom passivation layer 111. Specifically, the cleaning process may remove oxide, originating from oxidation by oxygen in the air, from the portion of the top surface of the topmost conductive line of the first conductive pattern 107 without damaging thereto. The cleaning process may include applying a mixture of hydrogen and argon as a remote plasma source onto the pad openings 501. A process temperature of the cleaning process may be between about 250° C. and about 350° C. A process pressure of the cleaning process may be between about 1 Torr and about 10 Torr. A bias energy may be applied to the equipment performing the cleaning process. The bias energy may be between about 0 W and 200 W.

The passivation process may include soaking the intermediate semiconductor device with a precursor such as dimethylaminotrimethylsilane, tetramethylsilane, or the like at a process temperature between about 200° C. and about 400° C. An ultraviolet radiation may be used to facilitate the passivation process. The passivation process may passivate sidewalls of the pad openings 501 exposed through the pad openings 501 by sealing surface pores thereof. Undesirable sidewall growth, which may affect the electric characteristics of the semiconductor device 1A, may be reduced by the passivation process. As a result, the performance and reliability of the semiconductor device 1A may be increased.

It should be noted that, in the description of the present disclosure, a surface of an element (or a feature) located at the highest vertical level along the direction Z is referred to as a top surface of the element (or the feature). A surface of an element (or a feature) located at the lowest vertical level along the direction Z is referred to as a bottom surface of the element (or the feature).

With reference to FIG. 4, the first pads 121 may be formed in the pad openings 501. For convenience of description, only one first pad 121 is described. The top surface 121TS of the first pad 121 may be substantially coplanar with the top surface of the bottom passivation layer 111. The first pad 121 may be formed of, for example, aluminum, copper, aluminum-copper alloy, aluminum alloy, or copper alloy. In some embodiments, the first pad 121 may be designed for transmitting high speed signals. Alternatively, in some embodiments, the first pad 121 may be designed for transmitting low speed signals.

Figure 5:
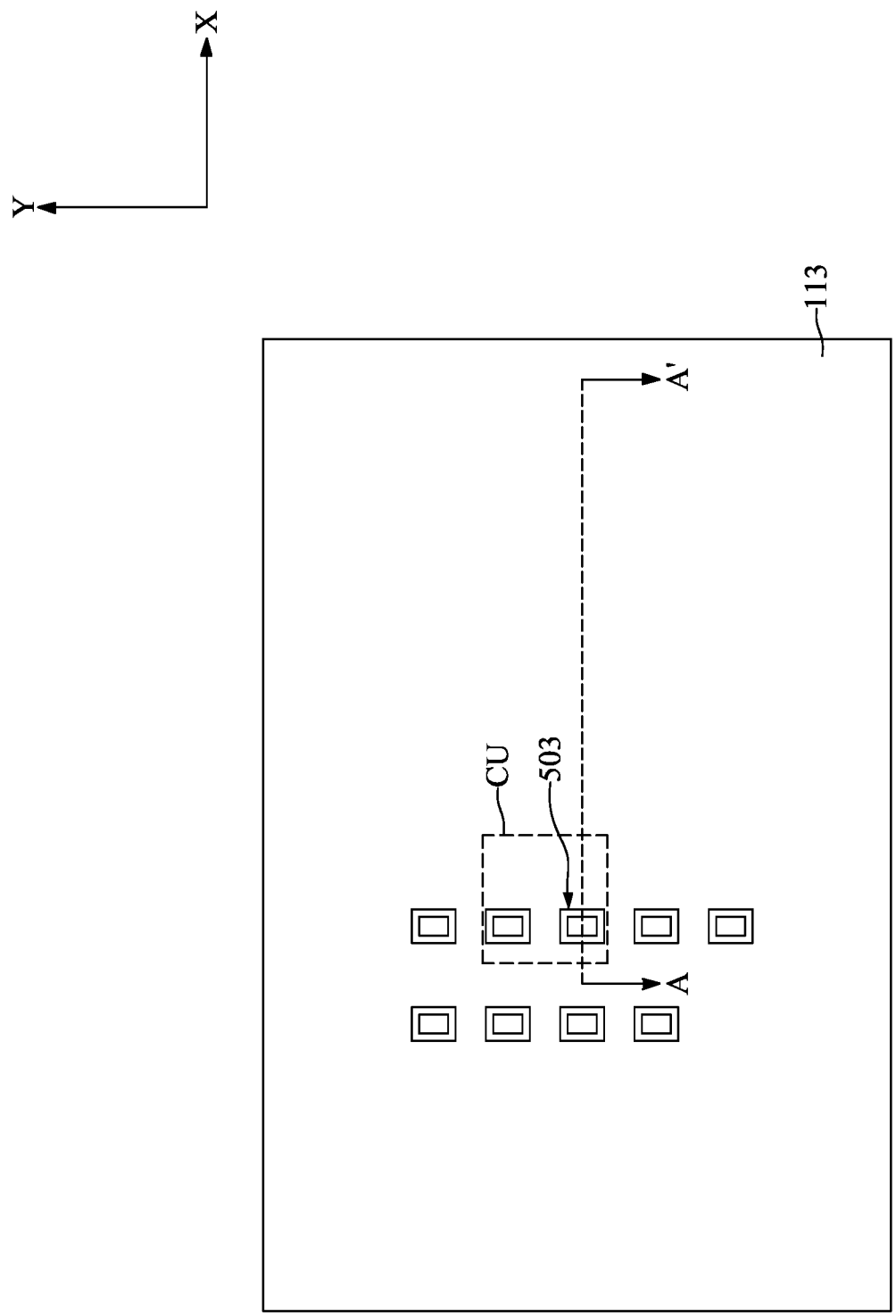
FIG. 5 illustrates, in a schematic top-view diagram, an intermediate semiconductor device in accordance with one embodiment of the present disclosure.
Figure 6:
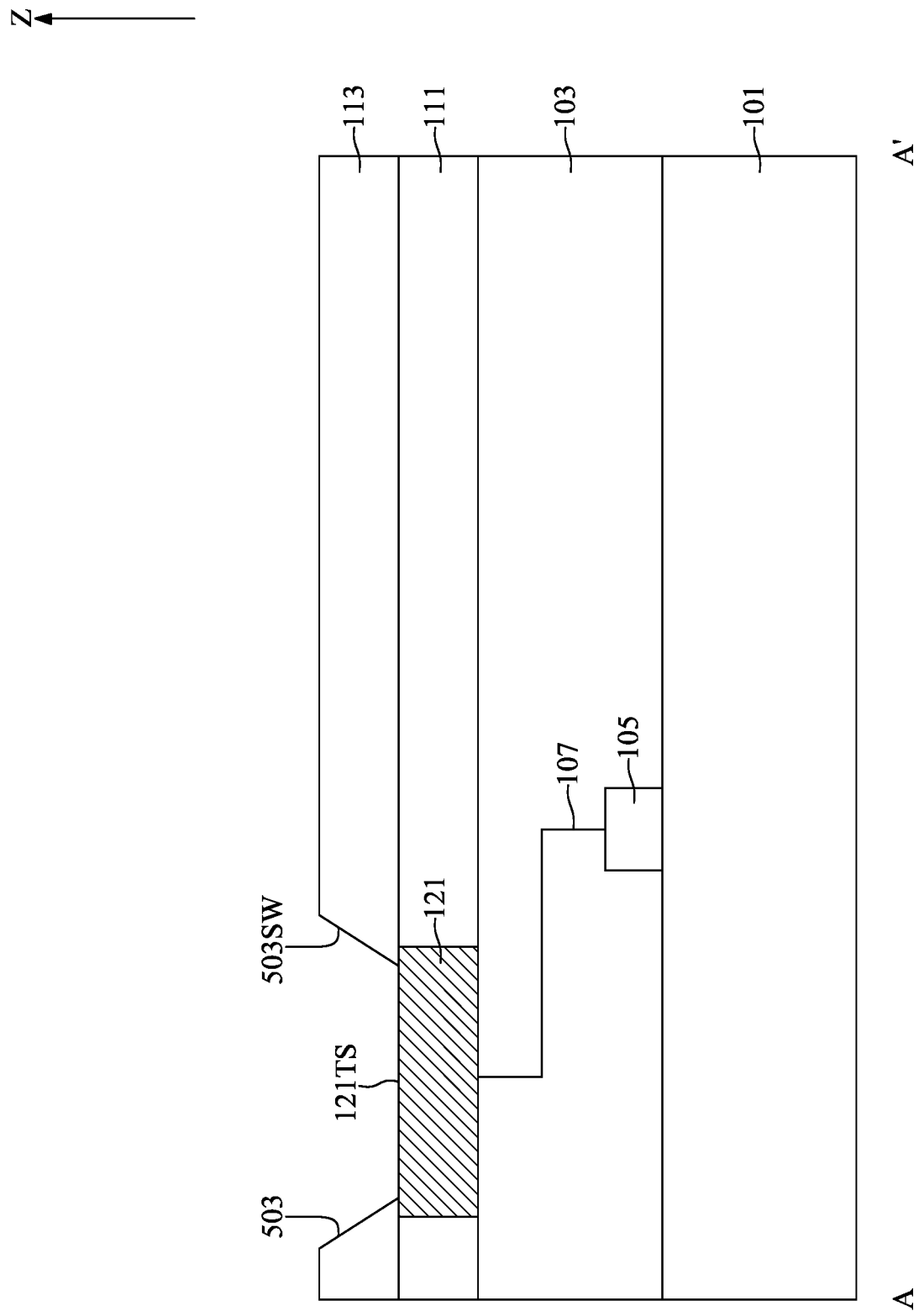
FIG. 6 is a schematic cross-sectional view diagram taken along the line A-A' in FIG. 5 illustrating part of the flow for fabricating the semiconductor device in accordance with one embodiment of the present disclosure.
Figure 7:
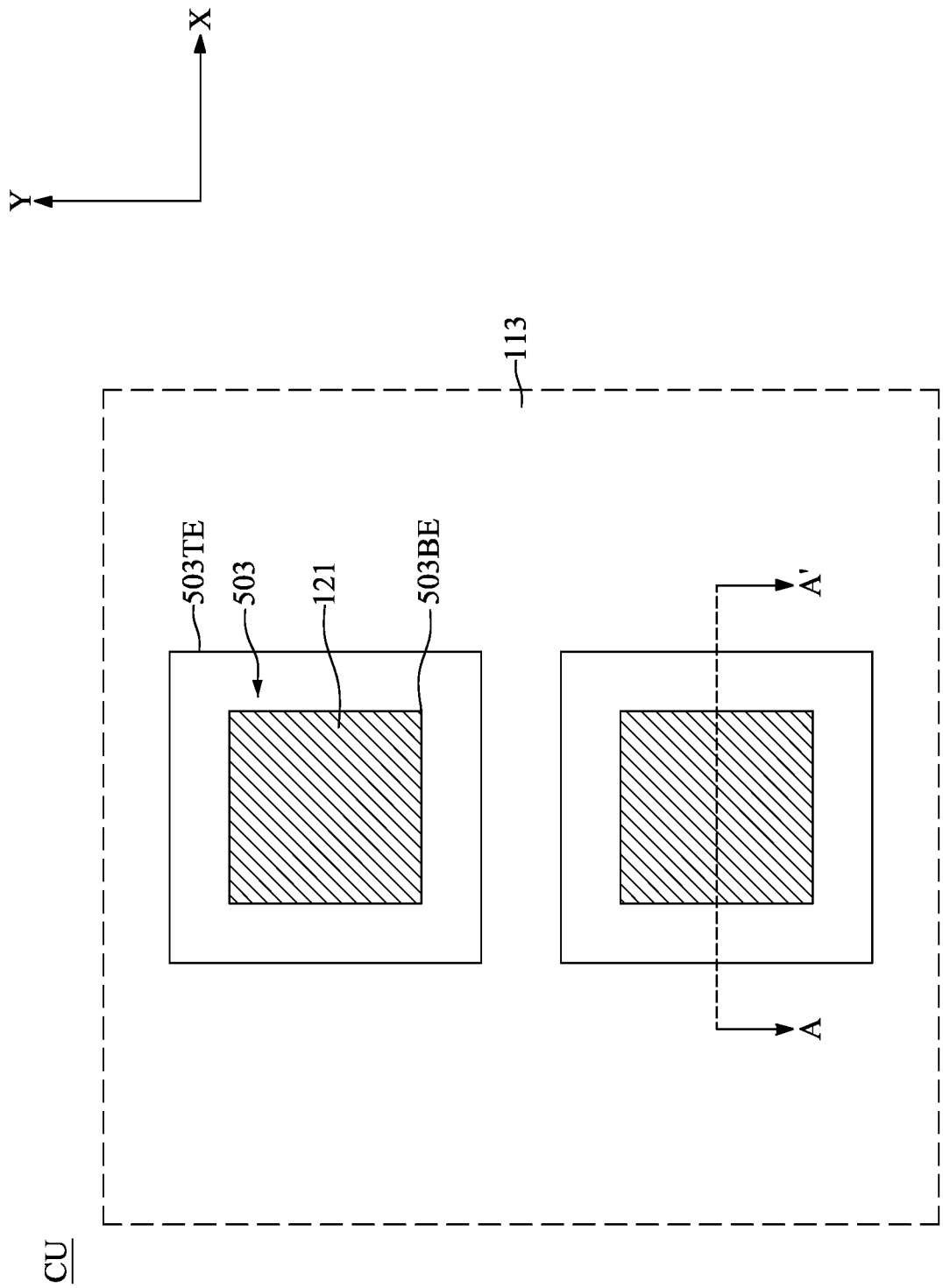
FIG. 7 illustrates, in a schematic close-up top-view diagram, an intermediate semiconductor device of the CU area in FIG. 6 in accordance with one embodiment of the present disclosure.
Figure 8:
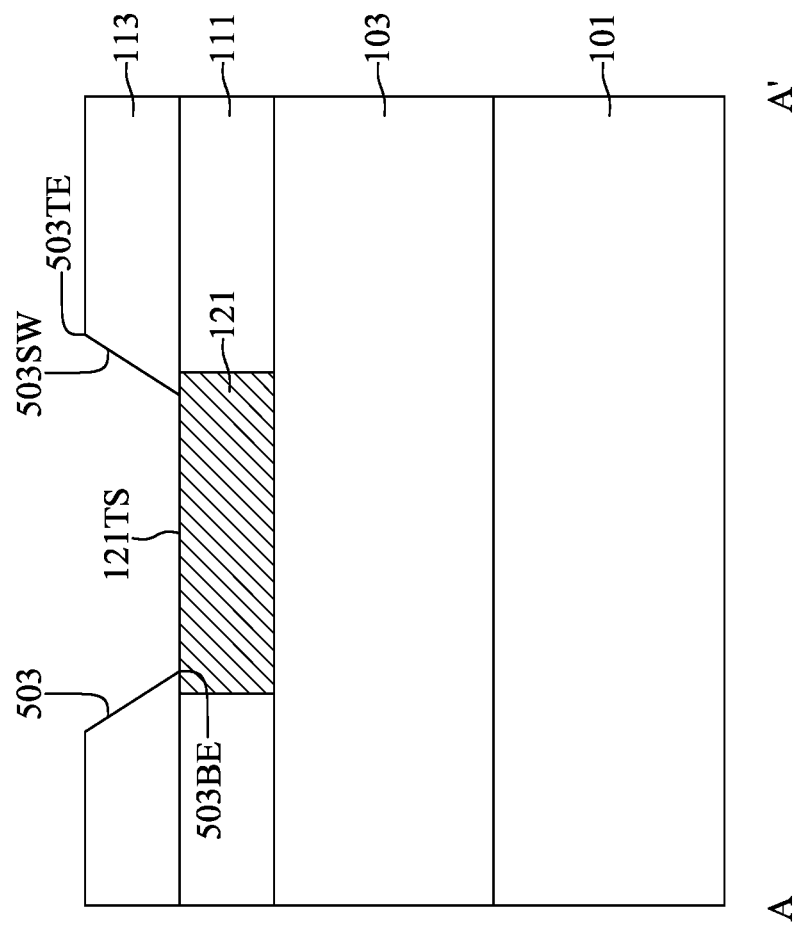
FIG. 8 is a schematic cross-sectional view diagram taken along the line A-A' in FIG. 7.

FIG. 5 illustrates, in a schematic top-view diagram, an intermediate semiconductor device in accordance with one embodiment of the present disclosure. FIG. 6 is a schematic cross-sectional view diagram taken along the line A-A' in FIG. 5 illustrating part of the flow for fabricating the semiconductor device 1A in accordance with one embodiment of the present disclosure. FIG. 7 illustrates, in a schematic close-up top-view diagram, an intermediate semiconductor device of the CU area in FIG. 6 in accordance with one embodiment of the present disclosure. FIG. 8 is a schematic cross-sectional view diagram taken along the line A-A' in FIG. 7.

With reference to FIG. 1 and FIGS. 5 to 8, at step S13, a top passivation layer 113 may be formed on the bottom passivation layer 111 and passivation layer openings 503 may be formed along the top passivation layer 113.

With reference to FIGS. 5 and 6, the top passivation layer 113 may be formed on the bottom passivation layer 111 and the first pads 121. In some embodiments, the top passivation layer 113 may be formed of, for example, silicon nitride, silicon oxynitride, or silicon oxide nitride. The top passivation layer 113 may serve as a high vapor barrier in order to prevent moisture from entering from above. Alternatively, in some embodiments, the top passivation layer 113 may be formed of, for example, silicon oxide, silicon nitride, silicon oxynitride, silicon oxide nitride, polyimide, polybenzoxazole, phosphosilicate glass, undoped silica glass, or fluoride silicate glass.

It should be noted that, in description of the present disclosure, silicon oxynitride refers to a substance which contains silicon, nitrogen, and oxygen and in which a proportion of oxygen is greater than that of nitrogen. Silicon nitride oxide refers to a substance which contains silicon, oxygen, and nitrogen and in which a proportion of nitrogen is greater than that of oxygen.

With reference to FIGS. 5 and 6, the passivation layer openings 503 may be formed along the top passivation layer 113 by a photolithography process and a subsequently etch process. For convenience of description, only one passivation layer opening 503 is described. A portion of the top surface 121TS of the first pad 121 may be exposed through the passivation layer opening 503. In some embodiments, the passivation layer opening 503 may include tapered sidewalls 503SW.

With reference to FIGS. 7 and 8, specifically, each of the tapered sidewalls 503SW may extend from the bottom edge 503BE of the passivation layer opening 503 to the top edge 503TE of the passivation layer opening 503 in a cross-sectional perspective. The bottom edge 503BE of the passivation layer opening 503 may have a rectangular shape, and the top edge 503TE of the passivation layer opening 503 may also have a rectangular shape in a top-view perspective. The bottom edge 503BE of the passivation layer opening 503 may define an exposed region of the top surface 121TS of the first pad 121.

In some embodiments, a cleaning process and a passivation process may be performed to the passivation layer openings 503 with a procedure similar to that is performed to the pad openings 501 illustrated in FIGS. 2 and 3. Undesirable sidewall growth, which may affect the electric characteristics of the semiconductor device 1A, may be reduced by the passivation process. As a result, the performance and reliability of the semiconductor device 1A may be increased.

Figure 9:
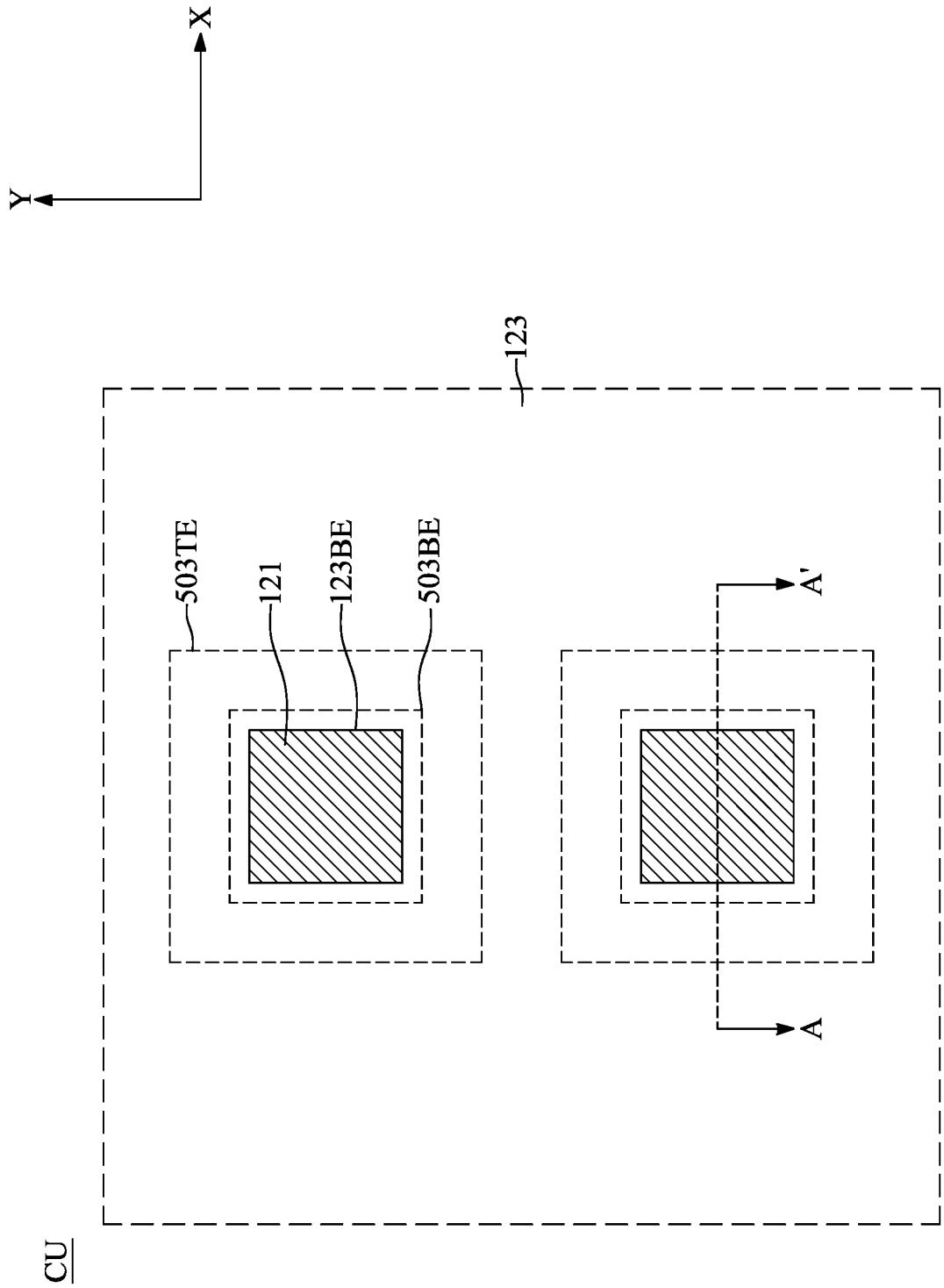
FIG. 9 illustrates, in a schematic close-up top-view diagram, an intermediate semiconductor device of the CU area in FIG. 6 in accordance with one embodiment of the present disclosure.
Figure 10:
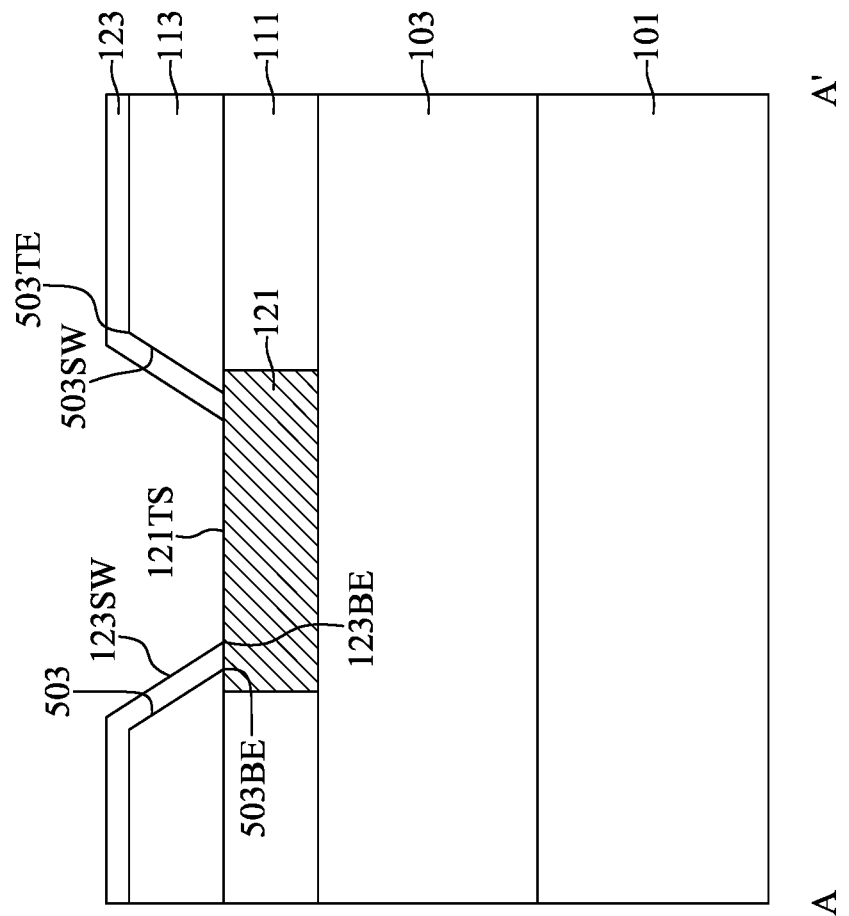
FIG. 10 is a schematic cross-sectional view diagram taken along the line A-A' in FIG. 9.

FIG. 9 illustrates, in a schematic close-up top-view diagram, an intermediate semiconductor device of the CU area in FIG. 6 in accordance with one embodiment of the present disclosure. FIG. 10 is a schematic cross-sectional view diagram taken along the line A-A' in FIG. 9.

With reference to FIG. 1 and FIGS. 9 and 10, at step S15, an insulating interface layer 123 may be formed on the top passivation layer 113.

With reference to FIGS. 9 and 10, the insulating interface layer 123 may be conformally formed on the top passivation layer 113 to reveal the exposed top surface 121TS of the first pad 121. The insulating interface layer 123 may conformally cover the tapered sidewalls 503SW of the passivation layer opening 503 to form corresponding tapered sidewalls 123SW. The bottom edge 123BE of the redistribution dielectric layer 270 may extend to cover the bottom edge 260BE of the passivation layer opening 503 and to contact the edge of the exposed top surface 121TS of the first pad 121.

The insulating interface layer 123 may provide electrically isolation or insulation capability to the semiconductor device 1A. Specifically, the insulating interface layer 123 may provide additional electrically isolate or insulate to the conductive features underlying thereof and the conductive features above thereof. In some embodiments, the redistribution dielectric layer 270 may be formed to include a photosensitive polymer material, such as a polyimide material. Alternatively, in some embodiments, the insulating interface layer 123 may be formed of, for example, silicon oxide, silicon nitride, silicon carbon nitride, silicon nitride oxide, or silicon oxynitride.

Figure 11:
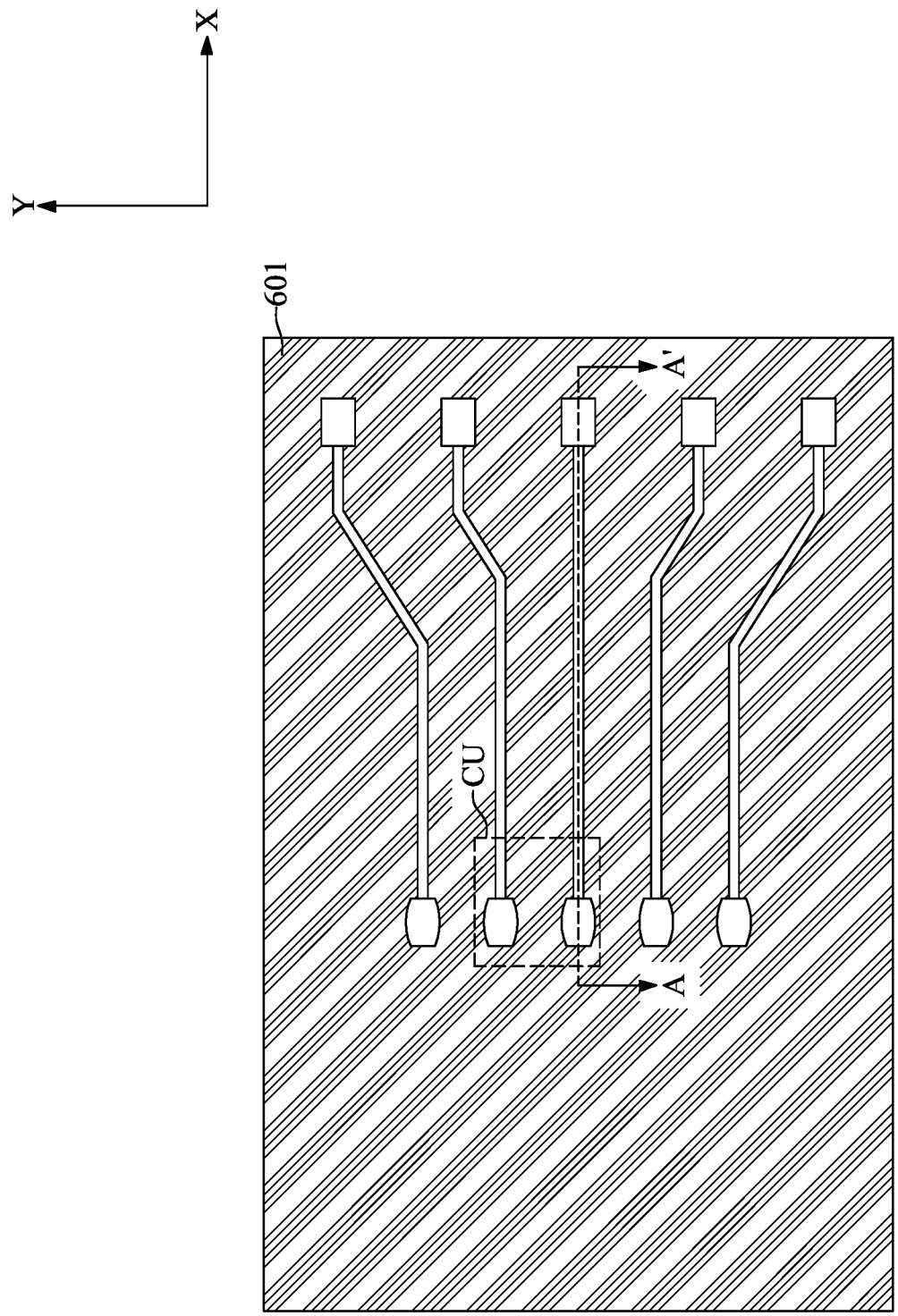
FIG. 11 illustrates, in a schematic top-view diagram, an intermediate semiconductor device in accordance with one embodiment of the present disclosure.
Figure 12:
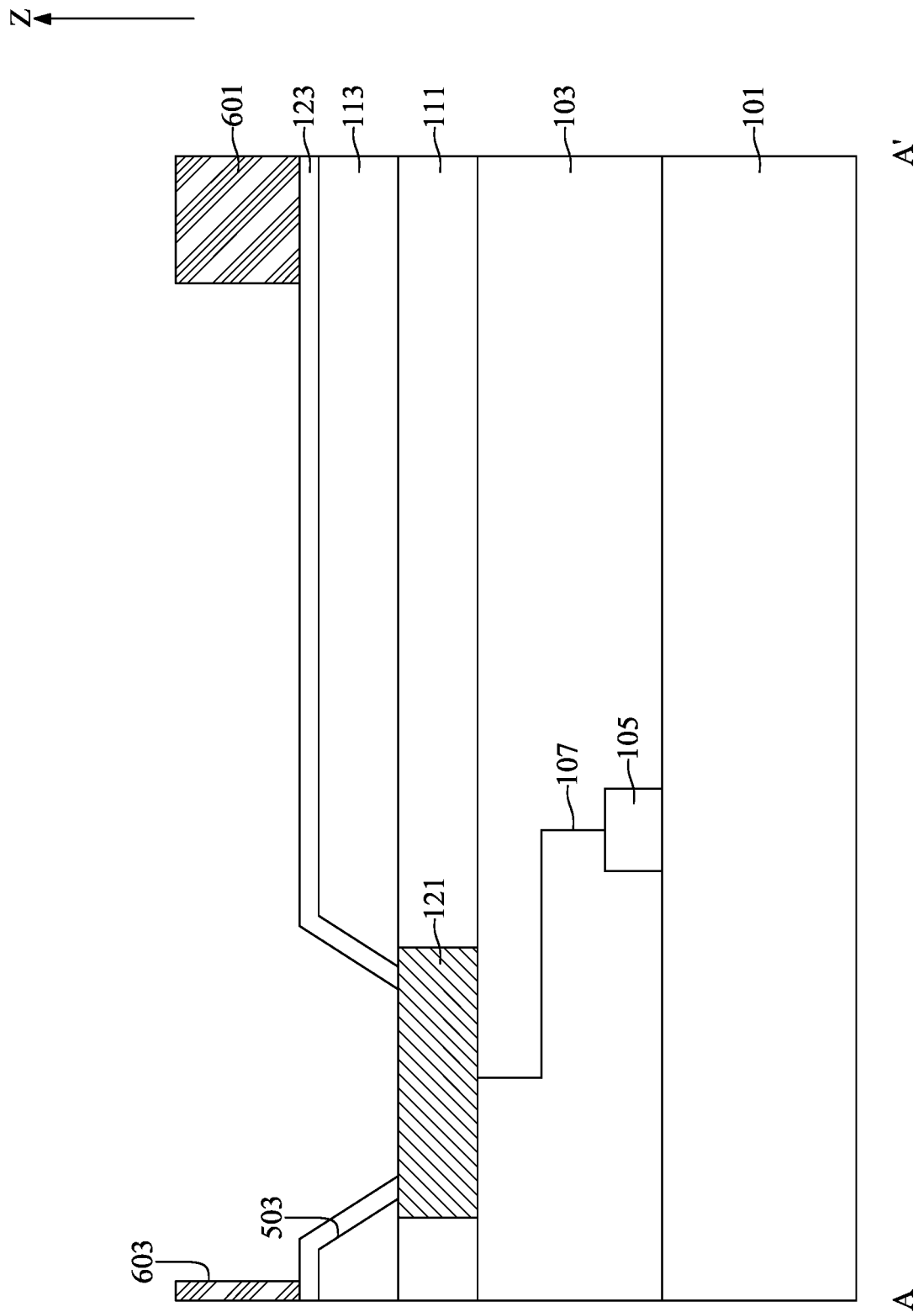
FIG. 12 is a schematic cross-sectional view diagram taken along the line A-A' in FIG. 11 illustrating part of the flow for fabricating the semiconductor device in accordance with one embodiment of the present disclosure.
Figure 13:
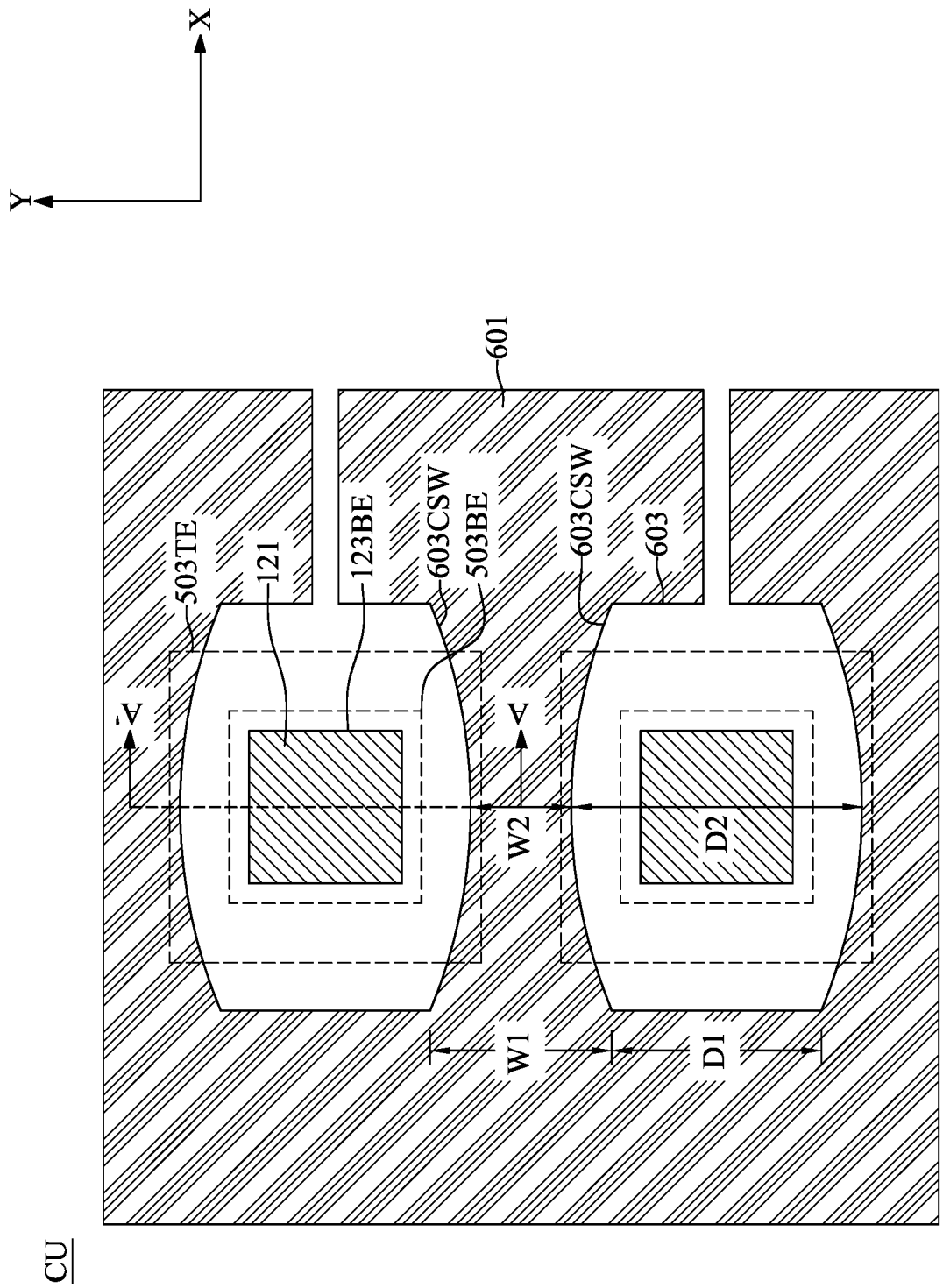
FIG. 13 illustrates, in a schematic close-up top-view diagram, an intermediate semiconductor device of the CU area in FIG. 11 in accordance with one embodiment of the present disclosure.
Figure 14:
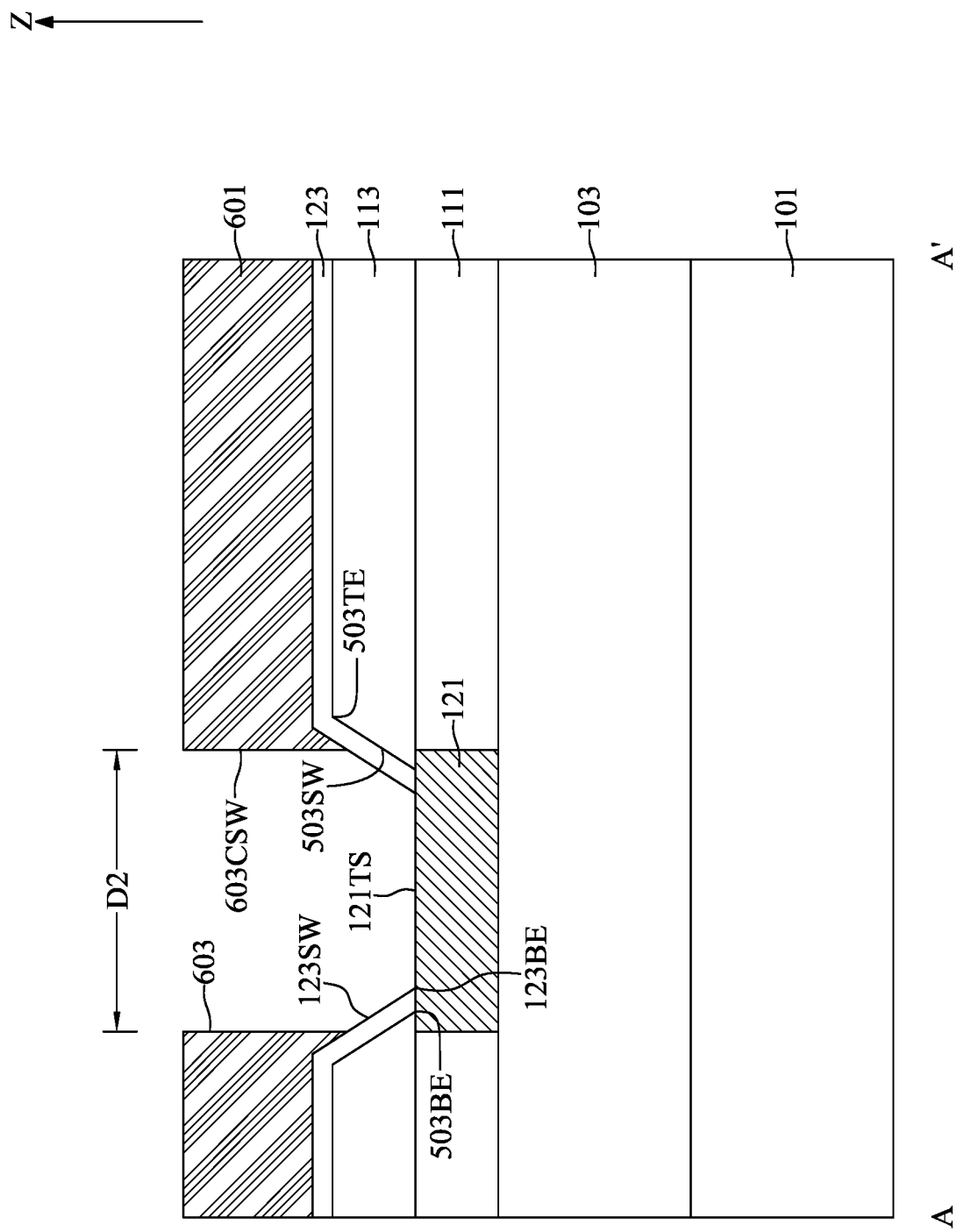
FIG. 14 is a schematic cross-sectional view diagram taken along the line A-A' in FIG. 13.

FIG. 11 illustrates, in a schematic top-view diagram, an intermediate semiconductor device in accordance with one embodiment of the present disclosure. FIG. 12 is a schematic cross-sectional view diagram taken along the line A-A' in FIG. 11 illustrating part of the flow for fabricating the semiconductor device 1A in accordance with one embodiment of the present disclosure. FIG. 13 illustrates, in a schematic close-up top-view diagram, an intermediate semiconductor device of the CU area in FIG. 11 in accordance with one embodiment of the present disclosure. FIG. 14 is a schematic cross-sectional view diagram taken along the line A-A' in FIG. 13.

With reference to FIG. 1 and FIGS. 11 to 14, at step S17, a first mask layer 601 may be formed on the insulating interface layer 123 and first mask openings 603 may be formed along the first mask layer 601.

With reference to FIGS. 11 and 12, the first mask layer 601 may be a photoresist layer. The first mask openings 603 may define the pattern of first redistribution structures 201. In a top-view perspective, the first mask openings 603 may be spaced apart from each other and may be arranged along a direction Y. For convenience of description, only one first mask opening 603 is described.

With reference to FIGS. 13 and 14, in a top-view perspective, the first mask opening 603 may include curved sidewalls 603CSW which are arranged horizontally. The upper curved sidewall 603CSW may have a convex shape. The lower curved sidewalls 603CSW may have a concave shape. The vertical distances parallel to the direction Y between the curved sidewalls 603CSW of the first mask opening 603 may vary between a relatively narrow distance D1 to a relatively wide distance D2 along a direction X perpendicular to the direction Y. Accordingly, the widths parallel to the direction Y between the curved sidewalls 603CSW of the first mask opening 603 and the curved sidewalls 603CSW of an adjacent one of the first mask opening 603 may vary between a relatively wider width W1 to a relatively narrow width W2 along the direction X.

The portion of the first mask layer 601 having wider width W1 may provide additional structural support to against collapse or deformation. In contrast, the portion of the first mask layer 601 having wider narrow width W2 may have relative low resistance against collapse or deformation. That is, the portion of the first mask layer 601 having wider narrow width W2 may be relatively fragile. However, the aforementioned structural support may compensate the relatively fragile portion of the first mask layer 601, the collapse or the deformation of the first mask layer 601 may be suppressed or reduced. That is, the first mask layer 601 and the first mask openings 603 may be structural stable even some portions of the first mask openings 603 are locate on the tapered sidewalls 123SW of the insulating interface layer 123. As a result, the first redistribution structures 201, which will be fabricated later, may have a larger planar area which indicating less surface resistivity and better electrical transmitting performance.

Figure 15:
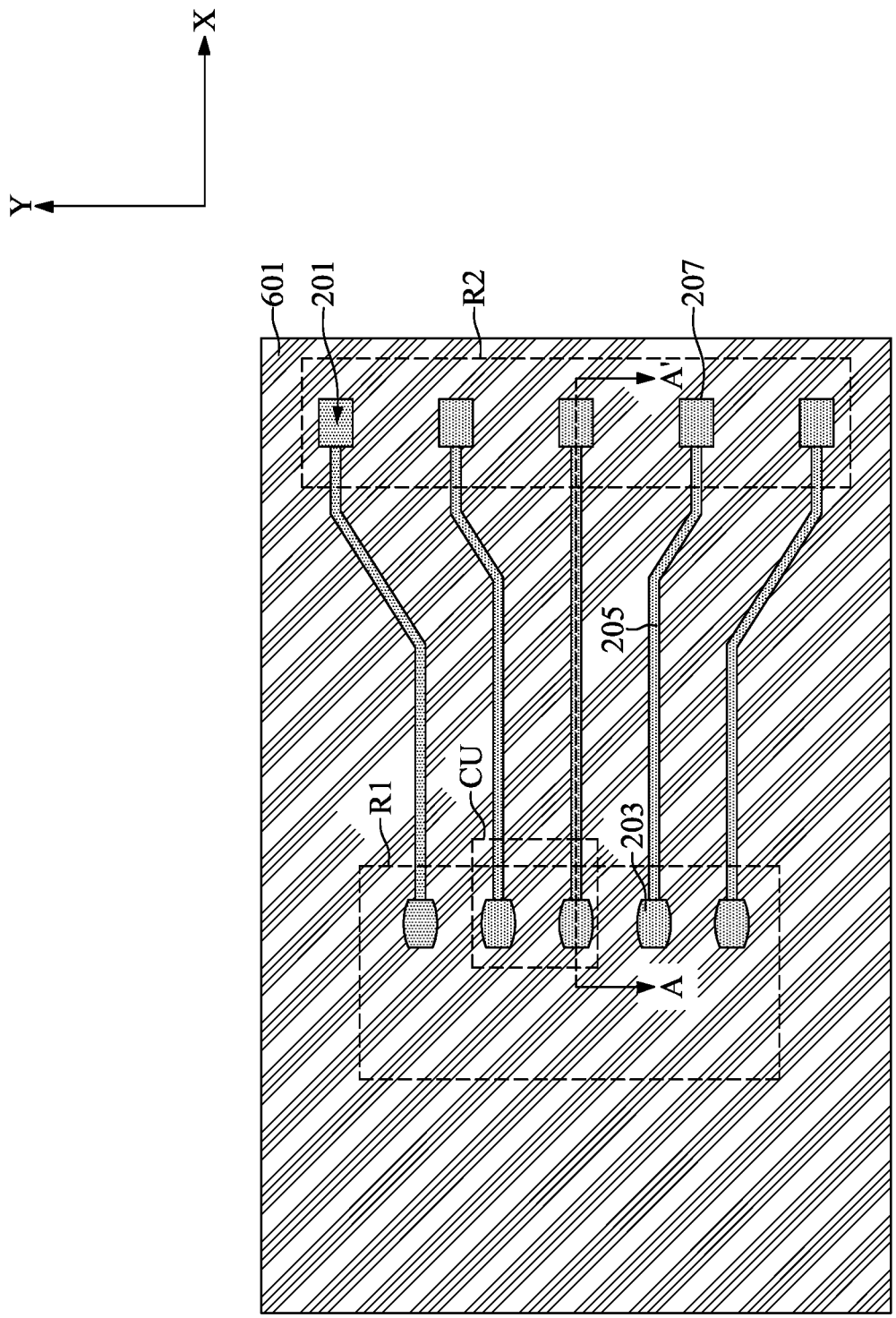
FIG. 15 illustrates, in a schematic top-view diagram, an intermediate semiconductor device in accordance with one embodiment of the present disclosure.
Figure 16:
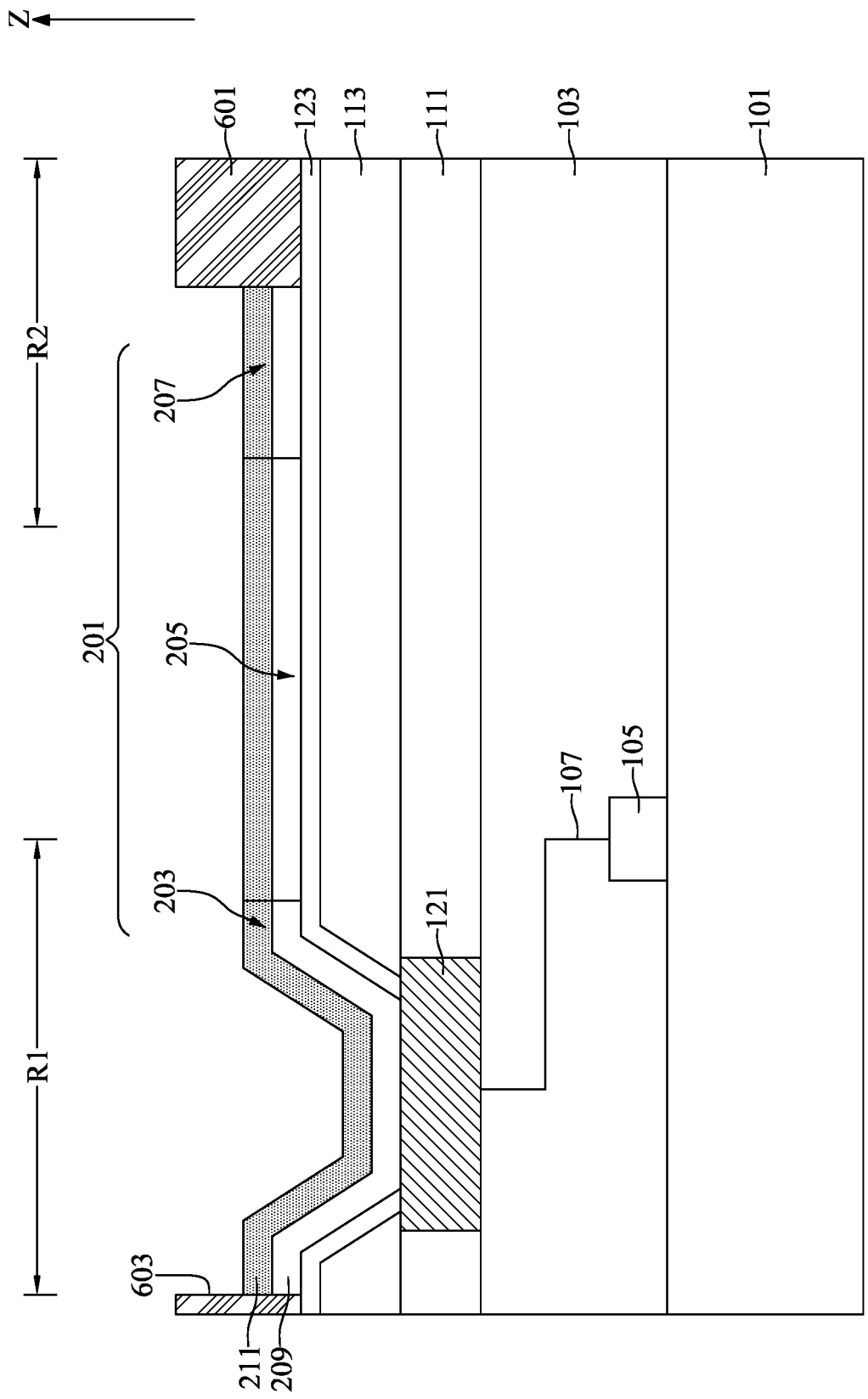
FIG. 16 is a schematic cross-sectional view diagram taken along the line A-A' in FIG. 15 illustrating part of the flow for fabricating the semiconductor device in accordance with one embodiment of the present disclosure.
Figure 17:
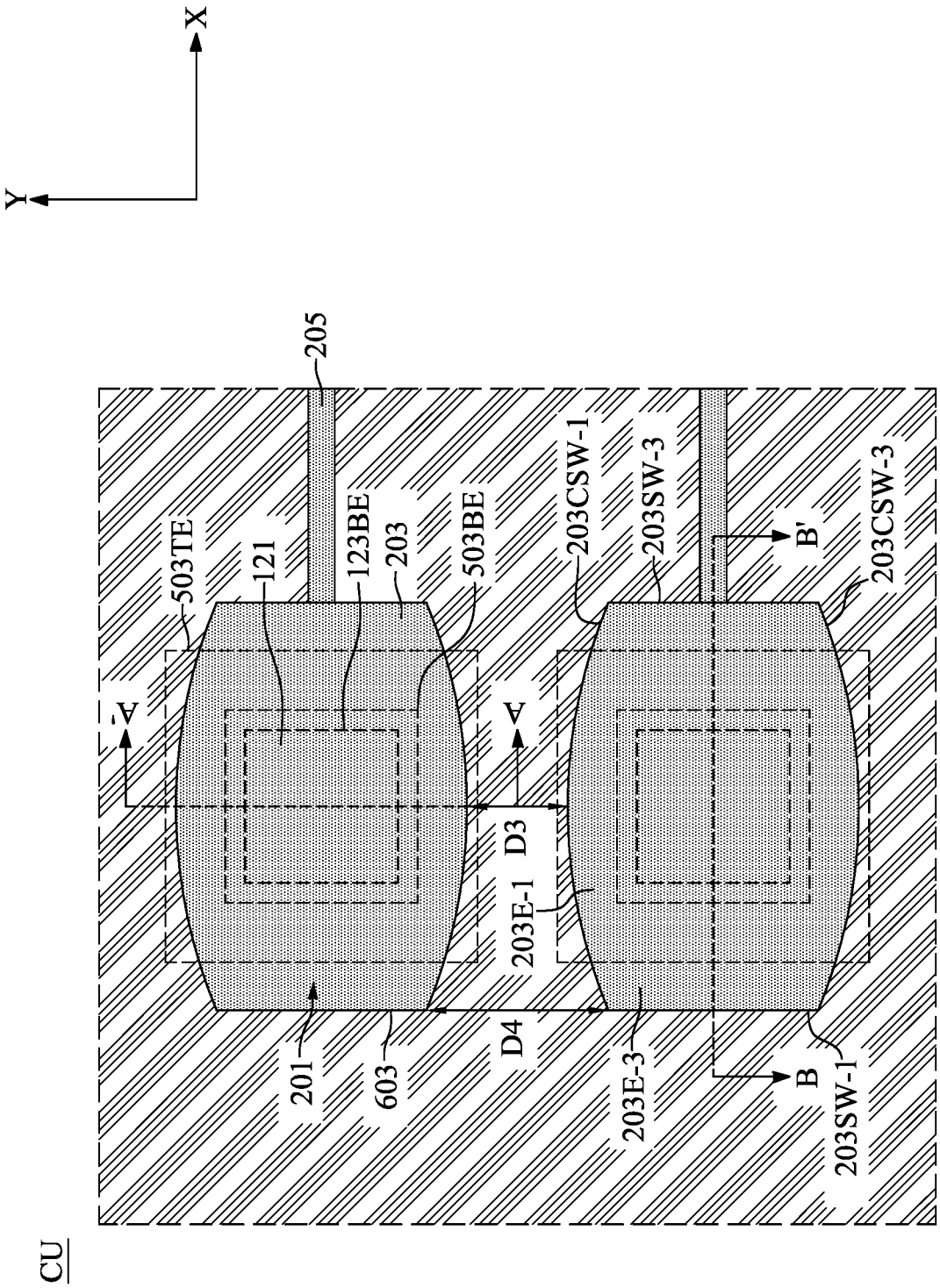
FIG. 17 illustrates, in a schematic close-up top-view diagram, an intermediate semiconductor device of the CU area in FIG. 15 in accordance with one embodiment of the present disclosure.
Figure 18:
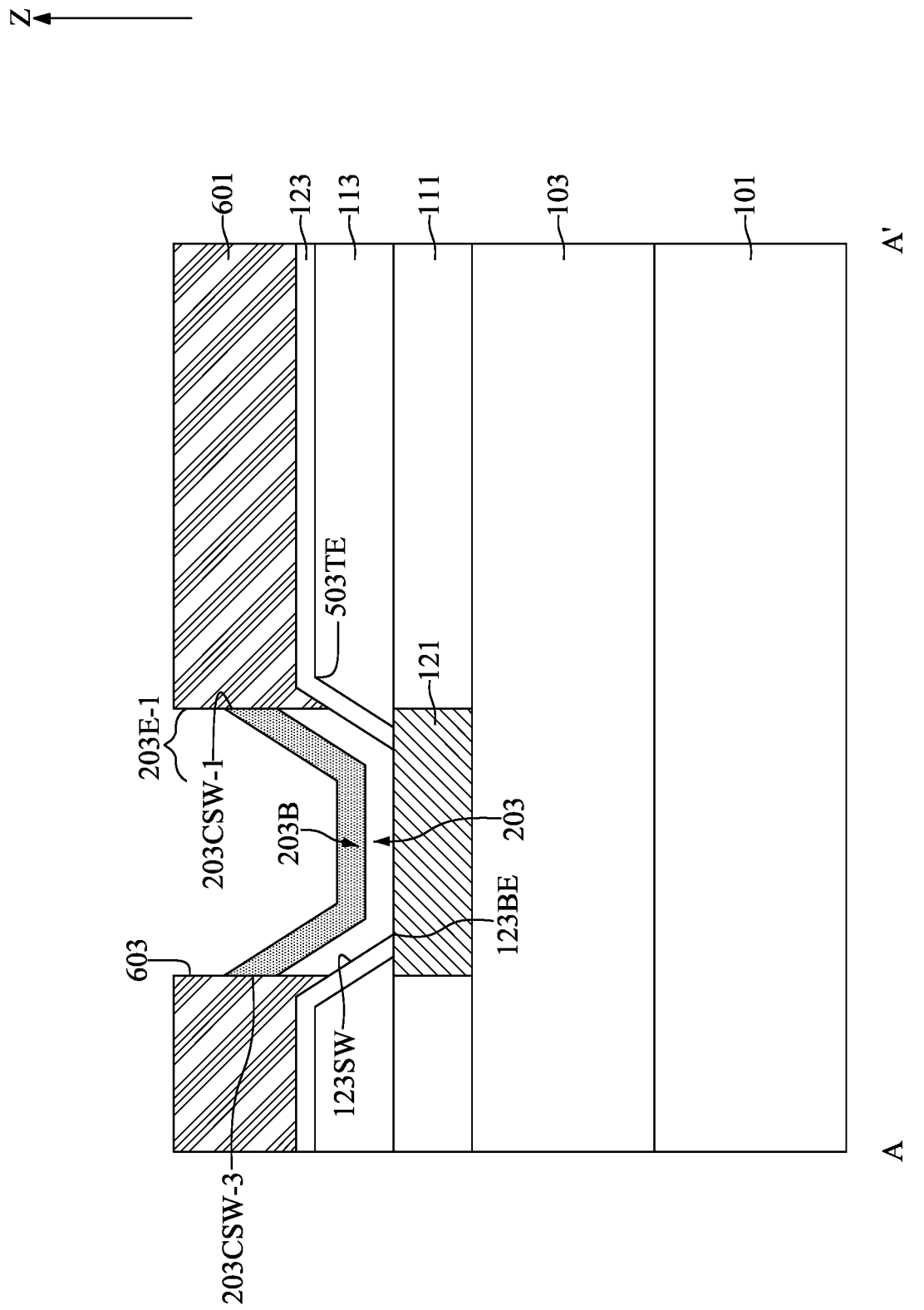
FIG. 18 is a schematic cross-sectional view diagram taken along the line A-A' in FIG. 17.
Figure 19:
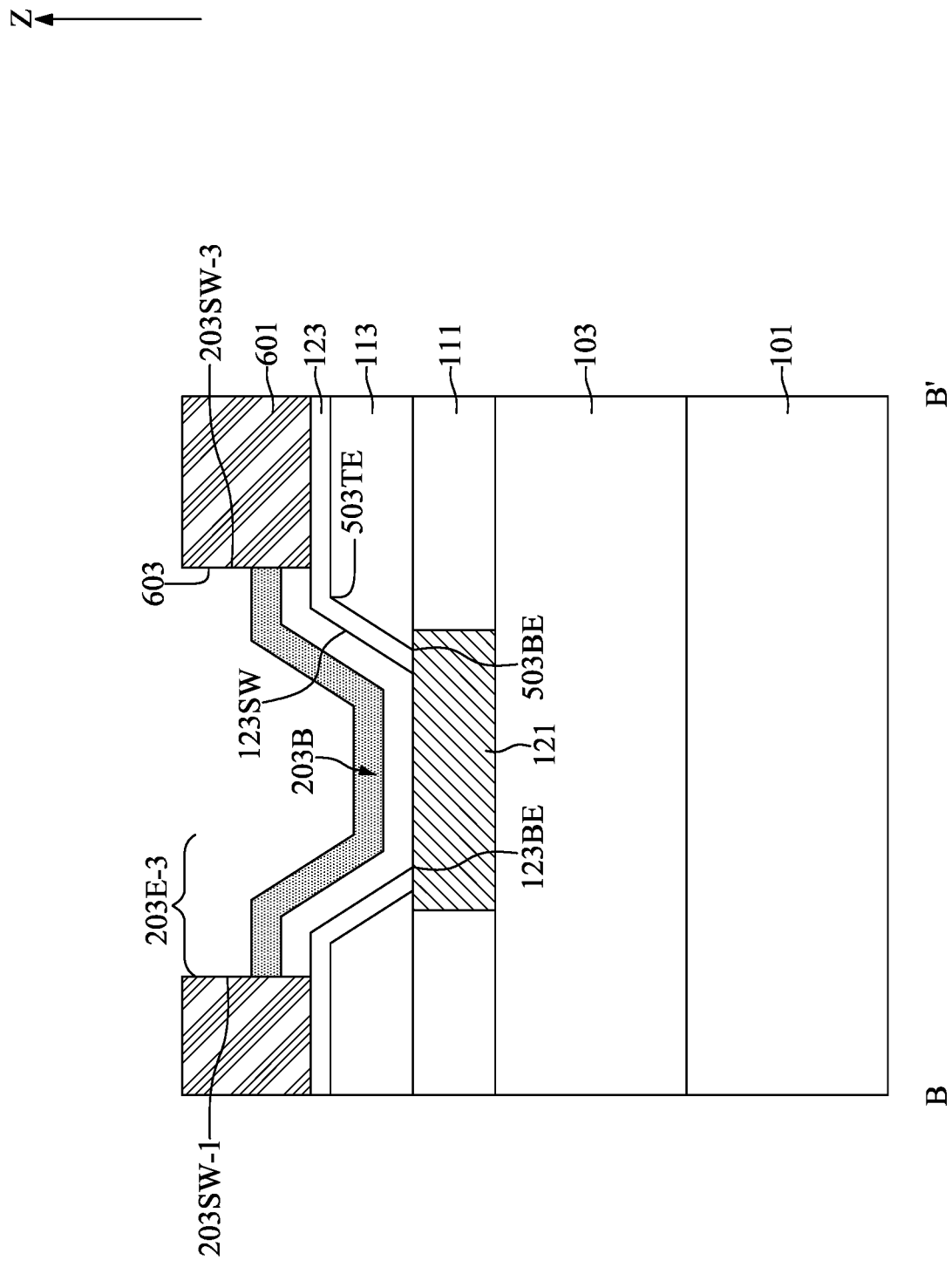
FIG. 19 is a schematic cross-sectional view diagram taken along the line B-B' in FIG. 17.

FIG. 15 illustrates, in a schematic top-view diagram, an intermediate semiconductor device in accordance with one embodiment of the present disclosure. FIG. 16 is a schematic cross-sectional view diagram taken along the line A-A' in FIG. 15 illustrating part of the flow for fabricating the semiconductor device 1A in accordance with one embodiment of the present disclosure. FIG. 17 illustrates, in a schematic close-up top-view diagram, an intermediate semiconductor device of the CU area in FIG. 15 in accordance with one embodiment of the present disclosure. FIG. 18 is a schematic cross-sectional view diagram taken along the line A-A' in FIG. 17. FIG. 19 is a schematic cross-sectional view diagram taken along the line B-B' in FIG. 17.

With reference to FIG. 1 and FIGS. 15 to 19, at step S19, the first redistribution structures 201 may be formed in the first mask openings 603.

With reference to FIG. 15, the first redistribution structures 201 may be formed in the first mask openings 603 and electrically coupled to the first pads 121. In a top-view perspective, each of the first redistribution structure 201 may be a conductive pattern that extends from a first region R1 to a second region R2. The first region R1 may be spaced apart from the second region R2. In some embodiments, the first region R1 may correspond to a central region of the semiconductor device 1A and the second region R2 may correspond to a peripheral region or an edge region of the semiconductor device 1A.

Specifically, in a top-view perspective, each of the first redistribution structures 201 may include a first redistribution overlapping unit 203, a first redistribution connecting unit 205, and a first redistribution contact unit 207. The first redistribution overlapping units 203 may be arrayed in one column which is parallel with the direction Y and located in the first region R1. The first redistribution contact units 207 may be arrayed in one column which is parallel with the direction Y and located in the second region R2. The first redistribution connecting unit 205 may connect the first redistribution overlapping unit 203 and the first redistribution contact unit 207. The first redistribution structure 201 may re-route the first pad 121 to gain more space for wiring or bumping and prevent the first pad 121 being affect by the stress of wiring or bumping.

With reference to FIG. 16, in a cross-sectional perspective, the first redistribution overlapping unit 203 may be formed on the first pad 121. That is, the first redistribution overlapping unit 203 may be vertically overlapped with the first pad 121. The first redistribution overlapping unit 203 may be electrically connected to the first pad 121. The first redistribution contact unit 207 may be electrically coupled to the first pad 121 through the first redistribution connecting unit 205 and the first redistribution overlapping unit 203. The first redistribution contact unit 207 may be used for wiring or bumping to electrically couple the semiconductor device 1A to an external device.

With reference to FIG. 16, in a cross-sectional perspective, each of the first redistribution structures 201 may be formed of a stacked layer structure. In some embodiments, each of the first redistribution structures 201 may include a first redistribution conductive layer 209 and a first redistribution thermal release layer 211. The first redistribution thermal release layer 211 may be formed on the first redistribution conductive layer 209. The first redistribution conductive layer 209 may be formed of the lower portion of the first redistribution overlapping unit 203, the lower portion of the first redistribution connecting unit 205, and the lower portion of the first redistribution contact unit 207. The first redistribution thermal release layer 211 may be formed of the upper portion of the first redistribution overlapping unit 203, the upper portion of the first redistribution connecting unit 205, and the upper portion of the first redistribution contact unit 207.

In some embodiments, the first redistribution conductive layer 209 may be formed of, for example, tungsten, titanium, tin, nickel, copper, gold, aluminum, platinum, cobalt, or a combination thereof. The first redistribution thermal release layer 211 may be formed of a carbon material that is imbued with a flexible material such as a polymer matrix. For example, the first redistribution thermal release layer 211 may include generally vertically oriented graphite and carbon nanotubes, which are imbued with a fluoropolymer rubber matrix. The aspect ratio of the carbon nanotubes may be between about 1:1 and about 1:100. For another example, the first redistribution thermal release layer 211 may include graphitic carbon. For yet another example, the first redistribution thermal release layer 211 may include pyrolytic graphite sheet.

In some embodiments, a thermal resistance of the first redistribution thermal release layer 211 may be less than 0.2° C. cm$^2$/Watt at a thickness between about 250 μm and about 450 μm. In some embodiments, the first redistribution thermal release layer 211 may be under compressive force after wiring or bumping. The compressive force may be between about 30 per square inch (psi) and about 90 psi. The thermal resistance of the first redistribution thermal release layer 211 under compressive force may be between about 0.3° C. cm$^2$/Watt. to 0.1° C. cm$^2$/Watt. The first redistribution thermal release layer 211 may provide thermal dissipation capability to the first redistribution structure 201.

With reference to FIG. 17, in a top-view perspective, the first redistribution overlapping unit 203 may include a first curved sidewall 203CSW-1, a second curved sidewall 203CSW-3, a third sidewall 203SW-1, and a fourth sidewall 203SW-3. The first curved sidewall 203CSW-1 may be horizontally arranged and may have a convex shape. The vertical distances parallel to the direction Y between the first curved sidewalls 203CSW-1 of adjacent first redistribution overlapping units 203 may vary between a relatively narrow distance D3 to a relatively wide distance D4 along the direction X. The second curved sidewall 203CSW-3 may be opposite to the first curved sidewall 203CSW-1 and may have a concave shape. That is, the first redistribution overlapping unit 203 may be point symmetric with respect to a central point of the first redistribution overlapping unit 203. For example, the first curved sidewall 203CSW-1 and the second curved sidewall 203CSW-3 may have a mirrored symmetry. The third sidewall 203SW-1 may connect a first edge of the first curved sidewall 203CSW-1 to a first edge of the second curved sidewall 203CSW-3. The fourth sidewall 203SW-3 may connect a second edge of the first curved sidewall 203CSW-1 to a second edge of the second curved sidewall 203CSW-3. The third sidewall 203SW-1 and the fourth sidewall 203SW-3 may be flat to be parallel with the direction Y. The first redistribution connecting unit 205 may be connected the fourth sidewall 203SW-3.

With reference to FIG. 18, in a cross-sectional perspective, the first curved sidewall 203CSW-1 may be located to overlap with the tapered sidewalls 123SW between the top edge 503TE and the bottom edge 503BE. With reference to FIGS. 17 to 19, although most of the first curved sidewall 203CSW-1 is formed to overlap with the tapered sidewalls 123SW, both of the first edge and the second edge of the first curved sidewall 203CSW-1 may be located out of the top edge 503TE to overlap with the flat top surface of the insulating interface layer 123.

With reference to FIG. 18, in a cross-sectional perspective, the first redistribution overlapping unit 203 may include a first expansion portion 203E-1 that extends from a bottom portion 203B of the first redistribution overlapping unit 203 to the first curved sidewall 203CSW-1. The bottom portion 203B may be a portion of the first redistribution overlapping unit 203 that is in direct contact with the first pad 121. Because the first curved sidewall 203CSW-1 corresponding to a side surface of the first expansion portion 203E-1 has a convex shape in a top-view perspective, the first expansion portion 203E-1 may have a half moon shape in a top-view perspective. The first expansion portion 203E-1 may be formed to overlap with a portion of the tapered sidewalls 123SW. In some embodiments, the distance between the first expansion portion 203E-1 and the bottom edge 503BE may be defined by controlling the thickness of the insulating interface layer 123.

With reference to FIG. 19, the first redistribution overlapping unit 203 may include a second expansion portion 203E-3 that extends from the bottom portion 203B to the third sidewall 203SW-1. The second expansion portion 203E-3 may extend onto an outside region of the tapered sidewalls 123SW to overlap with the horizontal top surface of the insulating interface layer 123.

With reference to FIGS. 17 to 19, the first redistribution overlapping unit 203 may have a shape of a nest which includes the bottom portion 203B, the first expansion portion 203E-1, and the second expansion portion 203E-3. The first expansion portion 203E-1 and second expansion portion 203E-3 may extend from the bottom portion 203B to cover both the bottom edge 123BE and the bottom edge 503BE. Thus, even though the first redistribution overlapping unit 203 is shifted from a normal position of the first redistribution overlapping unit 203 due to a process variation or the like, the first pad 121 may be still covered with the first redistribution overlapping unit 203. That is, an overlap margin between the first redistribution overlapping unit 203 and the first pad 121 may increase to significantly suppress or reduce a failure that the first pad 121 is exposed after the first redistribution overlapping unit 203 is formed.

After the formation of the first redistribution structure 201, the first mask layer 601 may be removed.

Figure 20:
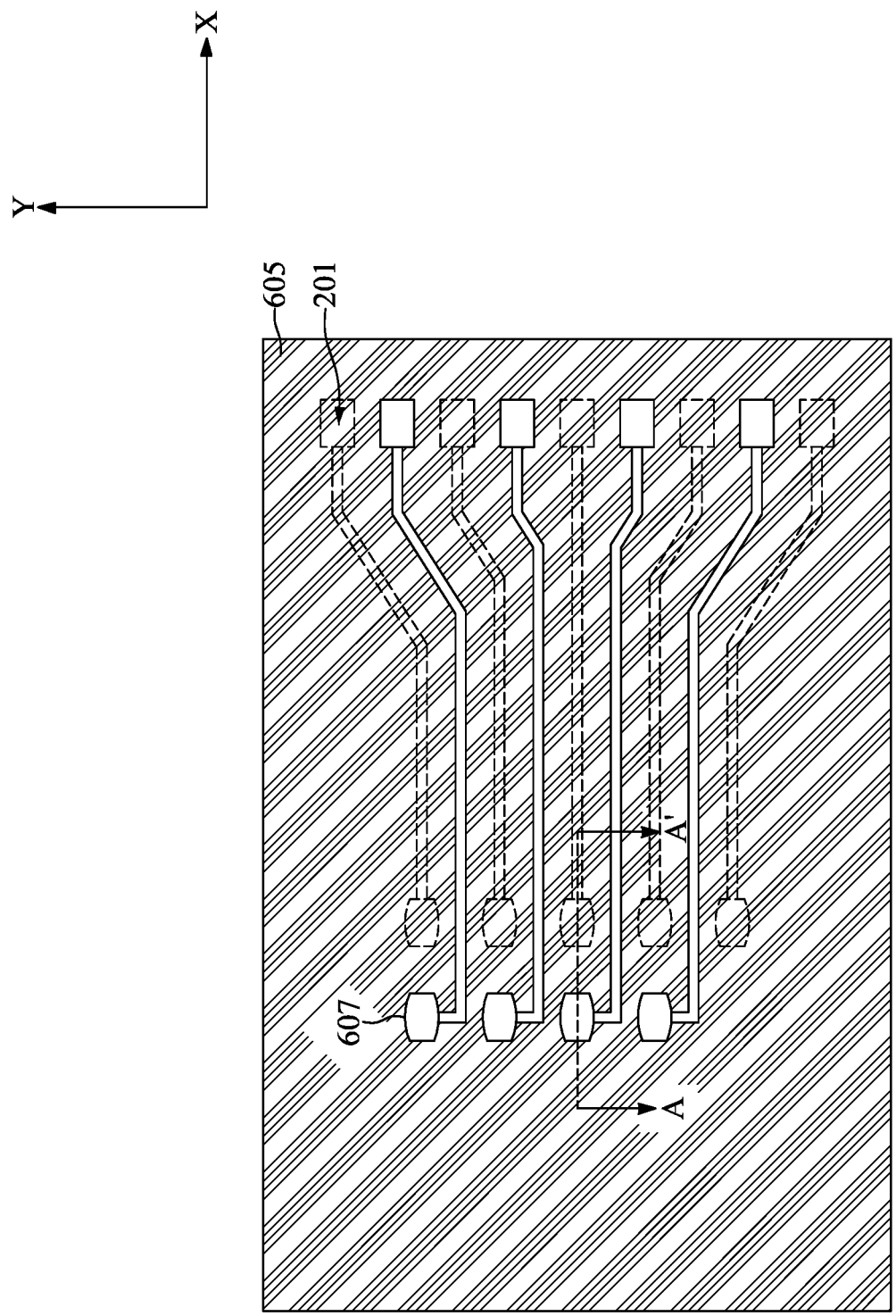
FIG. 20 illustrates, in a schematic top-view diagram, an intermediate semiconductor device in accordance with one embodiment of the present disclosure.
Figure 21:
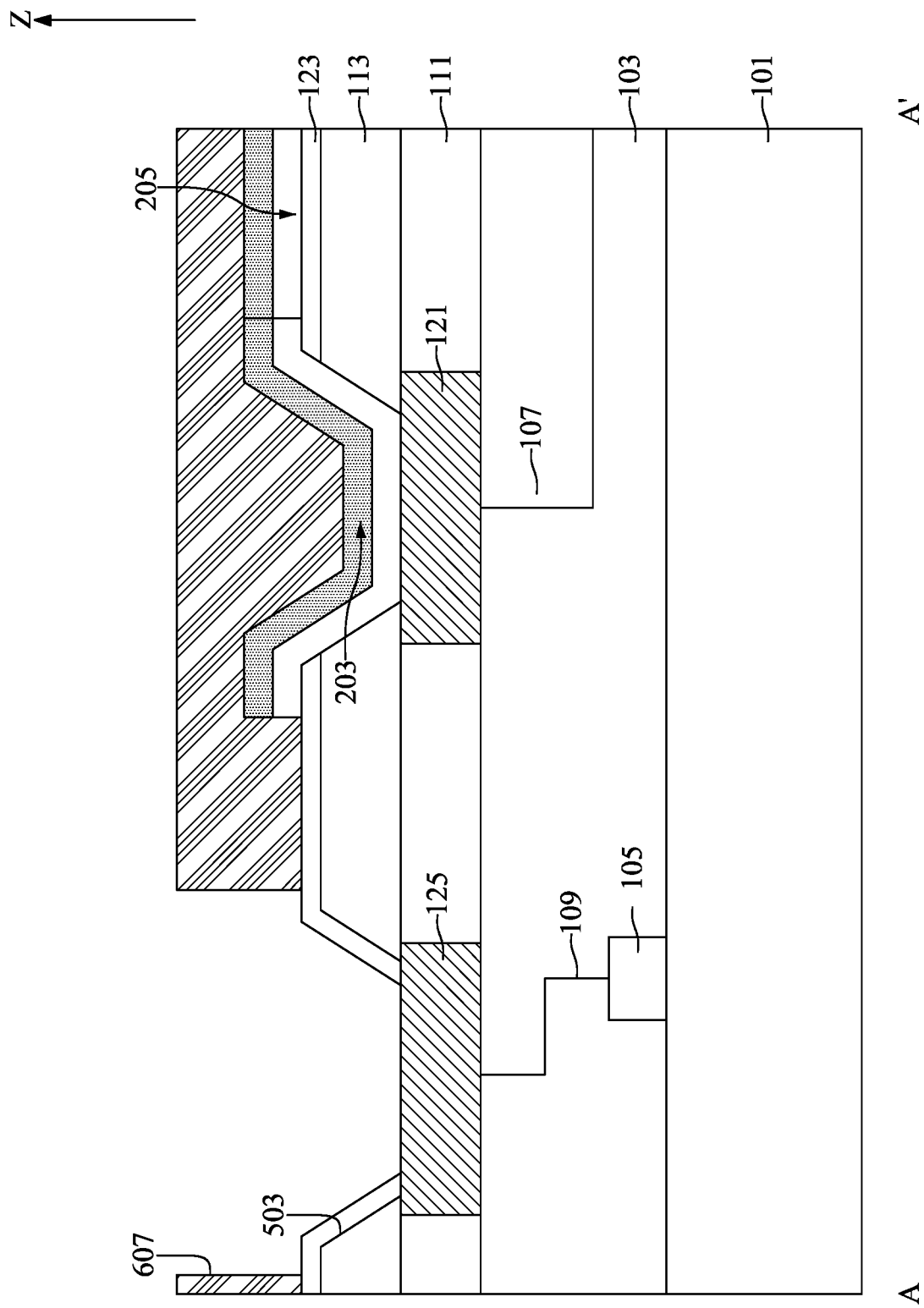
FIGS. 21 and 22 are schematic cross-sectional view diagrams taken along the line A-A' in FIG. 20 illustrating part of the flow for fabricating the semiconductor device in accordance with one embodiment of the present disclosure.
Figure 22:
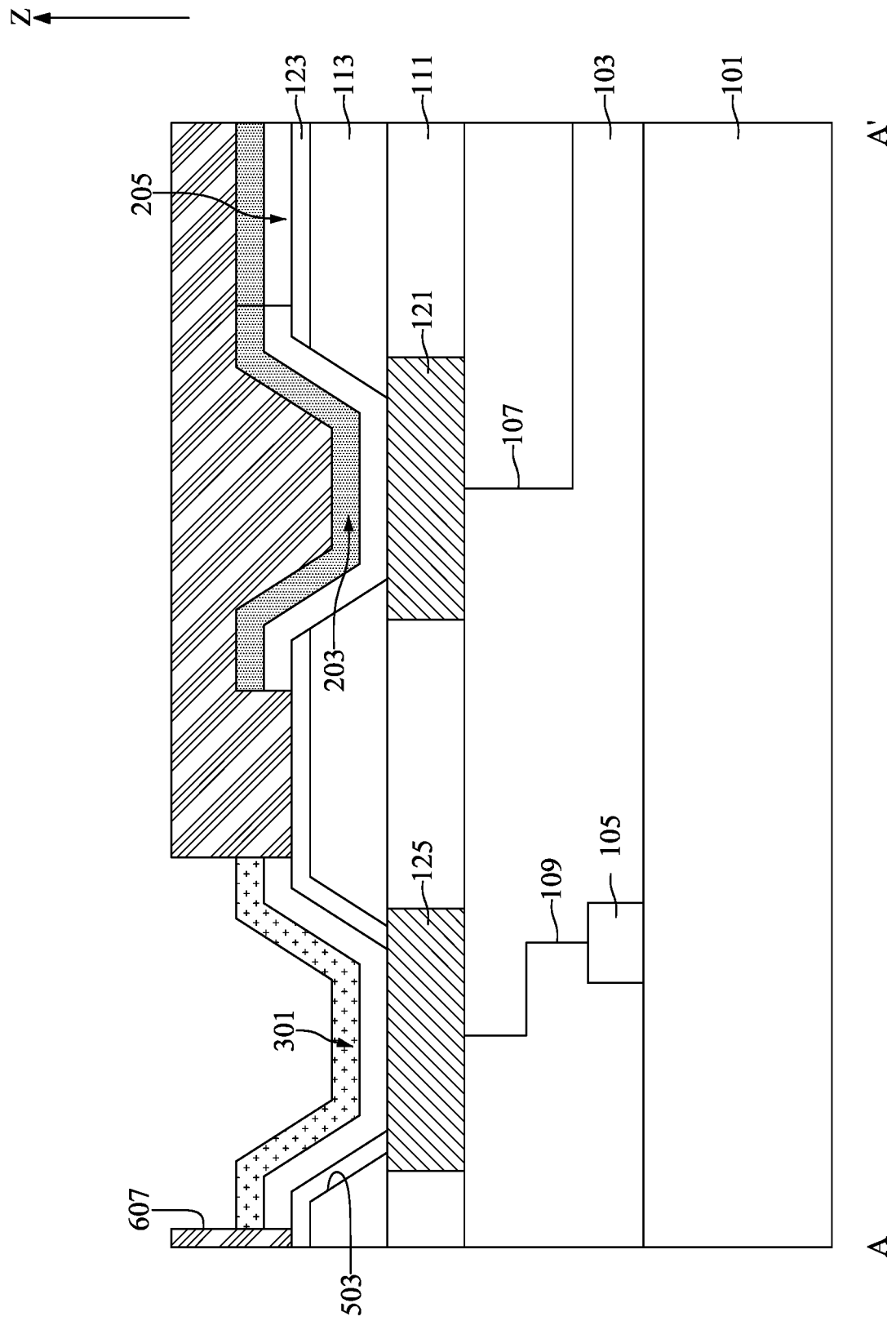
Figure 23:
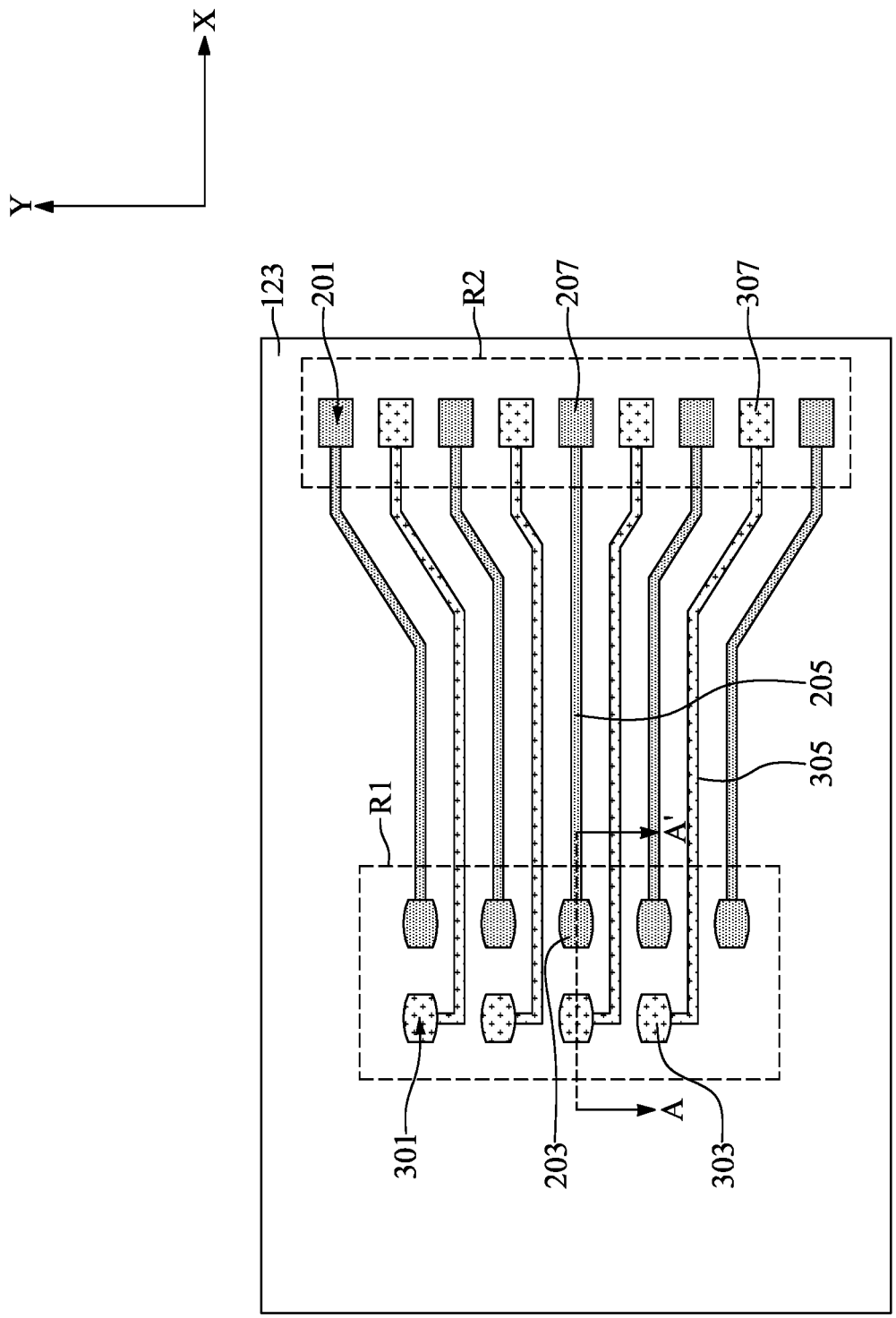
FIG. 23 illustrates, in a schematic top-view diagram, an intermediate semiconductor device in accordance with one embodiment of the present disclosure.
Figure 24:
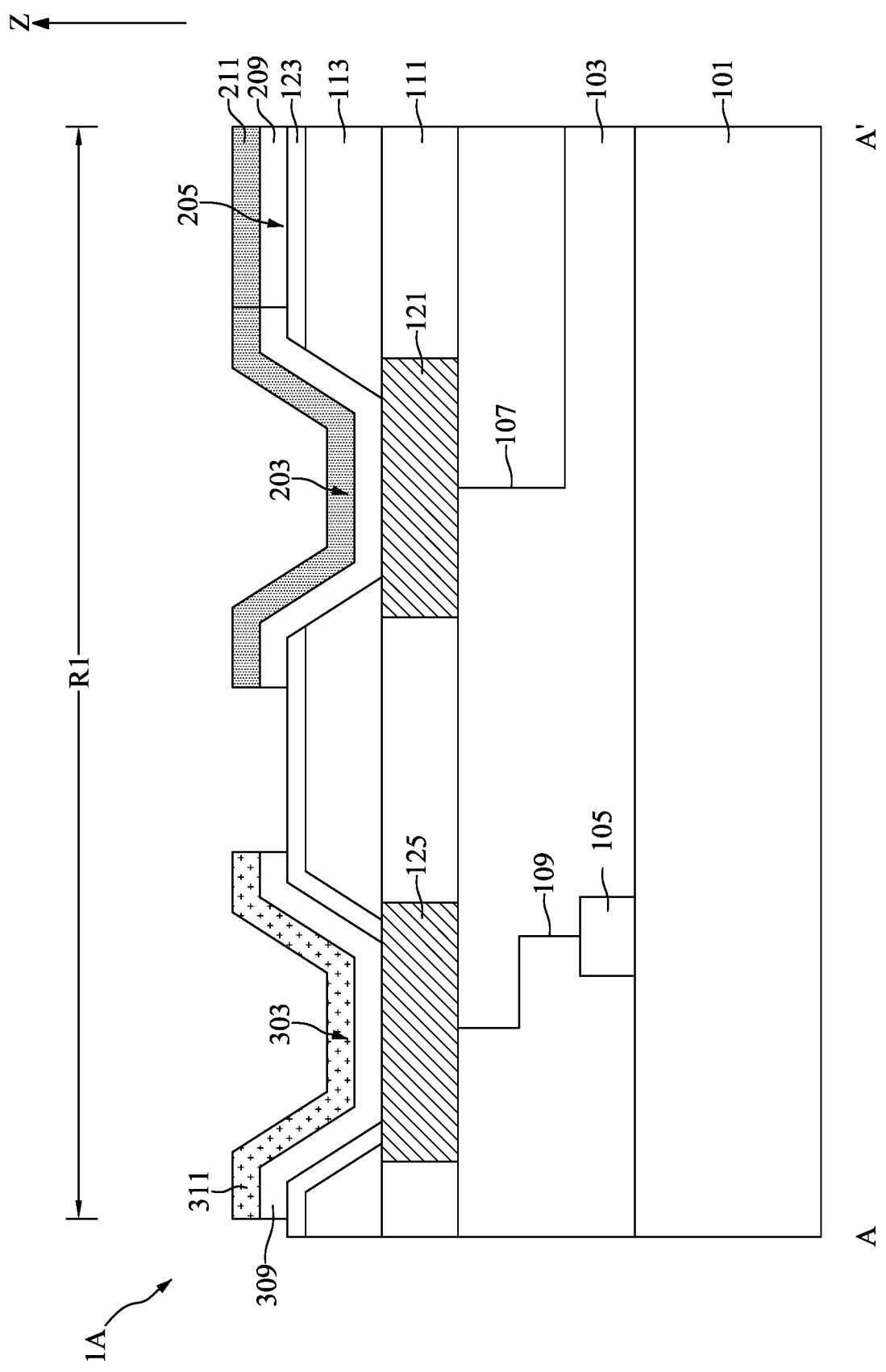
FIG. 24 is a schematic cross-sectional view diagram taken along the line A-A' in FIG. 23 illustrating part of the flow for fabricating the semiconductor device in accordance with one embodiment of the present disclosure.

FIG. 20 illustrates, in a schematic top-view diagram, an intermediate semiconductor device in accordance with one embodiment of the present disclosure. FIGS. 21 and 22 are schematic cross-sectional view diagrams taken along the line A-A' in FIG. 20 illustrating part of the flow for fabricating the semiconductor device 1A in accordance with one embodiment of the present disclosure. FIG. 23 illustrates, in a schematic top-view diagram, an intermediate semiconductor device in accordance with one embodiment of the present disclosure. FIG. 24 is a schematic cross-sectional view diagram taken along the line A-A' in FIG. 23 illustrating part of the flow for fabricating the semiconductor device 1A in accordance with one embodiment of the present disclosure.

With reference to FIG. 1 and FIGS. 20 to 24, at step S21, second redistribution structures 301 may be formed on the insulating interface layer 123.

With reference to FIGS. 20 and 21, a second mask layer 605 may be formed on the insulating interface layer 123 and the first redistribution structures 201. Second mask openings 607 may be formed along the second mask layer 605. The second mask layer 605 may be a photoresist layer. The second mask openings 607 may define the pattern of the second redistribution structure 301. In a top-view perspective, the second mask openings 607 may be spaced apart from each other and may be arranged along the direction Y. Portions of the passivation layer openings 503 may be exposed through the second mask openings 607. It should be noted that the second mask openings 607 are not overlap with the first redistribution structures 201 in a top-view perspective.

With reference to FIG. 22, the second redistribution structures 301 may be formed in the second mask openings 607 and electrically coupled to second pads 125 (only shown one in FIG. 22 for clarity). The second pads 125 may be electrically coupled to the device elements 105 through the second conductive pattern 109 formed in the interconnection layer 103. In some embodiments, the second pads 125 may be designed for transmitting high speed signals. Alternatively, in some embodiments, the second pads 125 may be designed for transmitting low speed signals.

With reference to FIGS. 23 and 24, the second mask layer 605 may be removed. In a top-view perspective, the first redistribution structures 201 and the second redistribution structures 301 may be spaced apart from each other and may also be electrically insulated or isolated from each other. The first redistribution structures 201 and the second redistribution structures 301 may be alternately and repeatedly arrayed along the direction Y. Each of the second redistribution structures 301 may include a second redistribution overlapping unit 303, a second redistribution connecting unit 305, and a second redistribution contact unit 307. The second redistribution overlapping unit 303 may be arrayed in one column which is parallel with the direction Y and located in the first region R1. The second redistribution contact unit 307 may be arrayed in one column which is parallel with the direction Y and located in the second region R2. The second redistribution connecting unit 305 may connect the second redistribution overlapping unit 303 and the second redistribution contact unit 307. The second redistribution structures 301 may re-route the second pads 125 to gain more space for wiring or bumping and prevent the second pads 125 being affect by the stress of wiring or bumping.

In some embodiments, in a top-view perspective, the first redistribution overlapping units 203 and the second redistribution overlapping units 303 may be formed on the first region R1 and may be arrayed in two columns which are parallel with the direction Y. For example, the first redistribution overlapping units 203 may be arrayed in one of the two columns, and the second redistribution overlapping units 303 may be arrayed in the other one of the two columns. The first redistribution contact units 207 and the second redistribution contact units 307 may be formed on the second region R2 and may be arrayed in one column which is parallel with the direction Y. Because the first redistribution contact units 207 and the second redistribution contact units 307 are formed on the second region R2, the first redistribution connecting units 205 and the second redistribution connecting units 305 may be line-shaped patterns extending from the first region R1 to the second region 203. In such situation, the second redistribution connecting units 305 may be spaced apart from the first redistribution overlapping units 203, and each of the second redistribution connecting units 305 may pass through a region between two adjacent ones of the first redistribution overlapping units 203. For convenience of description, only one second redistribution structure 301 is described.

With reference to FIGS. 23 and 24, in a cross-sectional perspective, the second redistribution structure 301 may be formed of a stacked layer structure. In some embodiments, the second redistribution structure 301 may include a second redistribution conductive layer 309 and a second redistribution thermal release layer 311. The second redistribution thermal release layer 311 may be formed on the second redistribution conductive layer 309. The second redistribution conductive layer 309 may be formed of the lower portion of the second redistribution overlapping unit 303, the lower portion of the second redistribution connecting unit 305, and the lower portion of the second redistribution contact unit 307. The second redistribution thermal release layer 311 may be formed of the upper portion of the second redistribution overlapping unit 303, the upper portion of the second redistribution connecting unit 305, and the upper portion of the second redistribution contact unit 307.

In some embodiments, the second redistribution conductive layer 309 may be formed of, for example, tungsten, titanium, tin, nickel, copper, gold, aluminum, platinum, cobalt, or a combination thereof. The second redistribution thermal release layer 311 may be formed of a carbon material that is imbued with a flexible material such as a polymer matrix. For example, the second redistribution thermal release layer 311 may include generally vertically oriented graphite and carbon nanotubes, which are imbued with a fluoropolymer rubber matrix. The aspect ratio of the carbon nanotubes may be between about 1:1 and about 1:100. For another example, the second redistribution thermal release layer 311 may include graphitic carbon. For yet another example, the second redistribution thermal release layer 311 may include pyrolytic graphite sheet.

In some embodiments, a thermal resistance of the second redistribution thermal release layer 311 may be less than $0.2°$ C. $cm^2$/Watt at a thickness between about 250 μm and about 450 μm. In some embodiments, the second redistribution thermal release layer 311 may be under compressive force after wiring or bumping. The compressive force may be between about 30 per square inch (psi) and about 90 psi. The thermal resistance of the second redistribution thermal release layer 311 under compressive force may be between about $0.3°$ C. $cm^2$/Watt. to $0.1°$ C. $cm^2$/Watt. The second redistribution thermal release layer 311 may provide thermal dissipation capability to the second redistribution structure 301.

In some embodiments, the second redistribution overlapping unit 303 may have a similar structure and shape as the first redistribution overlapping unit 203 illustrated in FIGS. 15 to 19.

In some embodiments, the thermal resistance of the second redistribution structure 301 may be the same as the first redistribution structure 201. In some embodiments, the thermal resistance of the second redistribution structure 301 may be different from the first redistribution structure 201. The thermal resistance of the second redistribution structure 301 and the thermal resistance of the first redistribution structure 201 may be tuned by the thickness thereof.

In some embodiments, the first redistribution structures 201 having thermal dissipation capability may be used to for transmitting high speed signals and the second redistribution structures 301 having thermal dissipation capability may be used to for transmitting low speed signals or vice versa.

Figure 25:
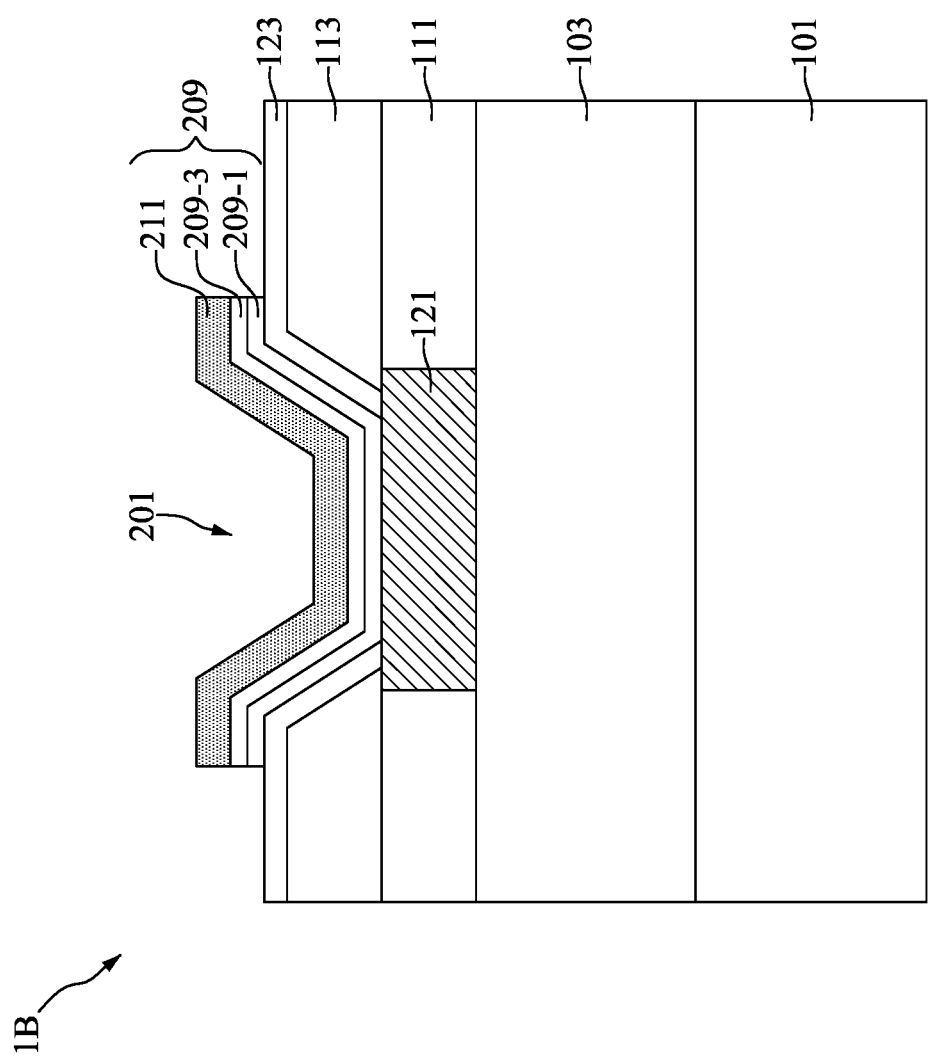
FIGS. 25 to 27 illustrate, in schematic cross-sectional view diagrams, semiconductor devices in accordance with some embodiments of the present disclosure.
Figure 26:
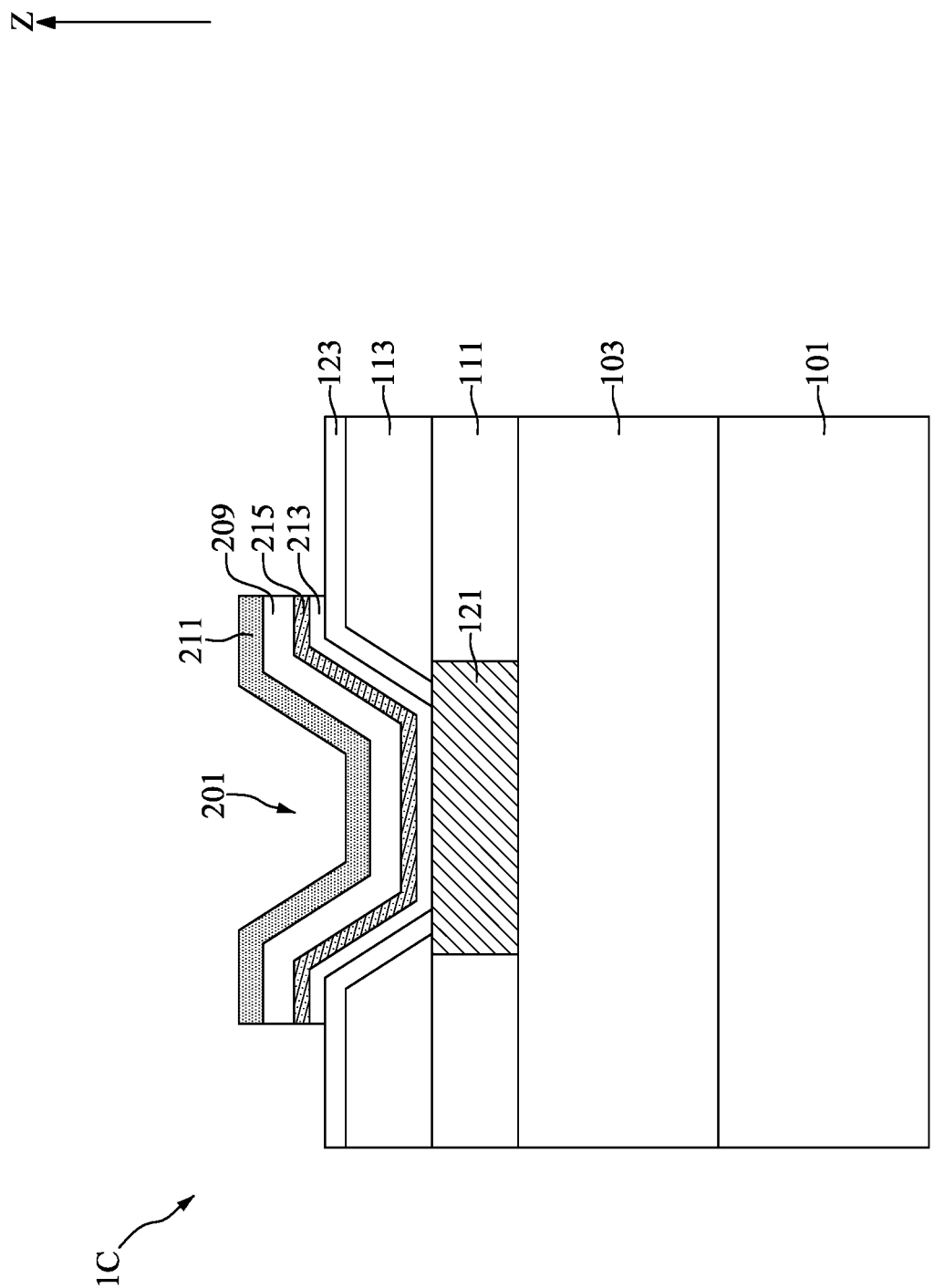
Figure 27:
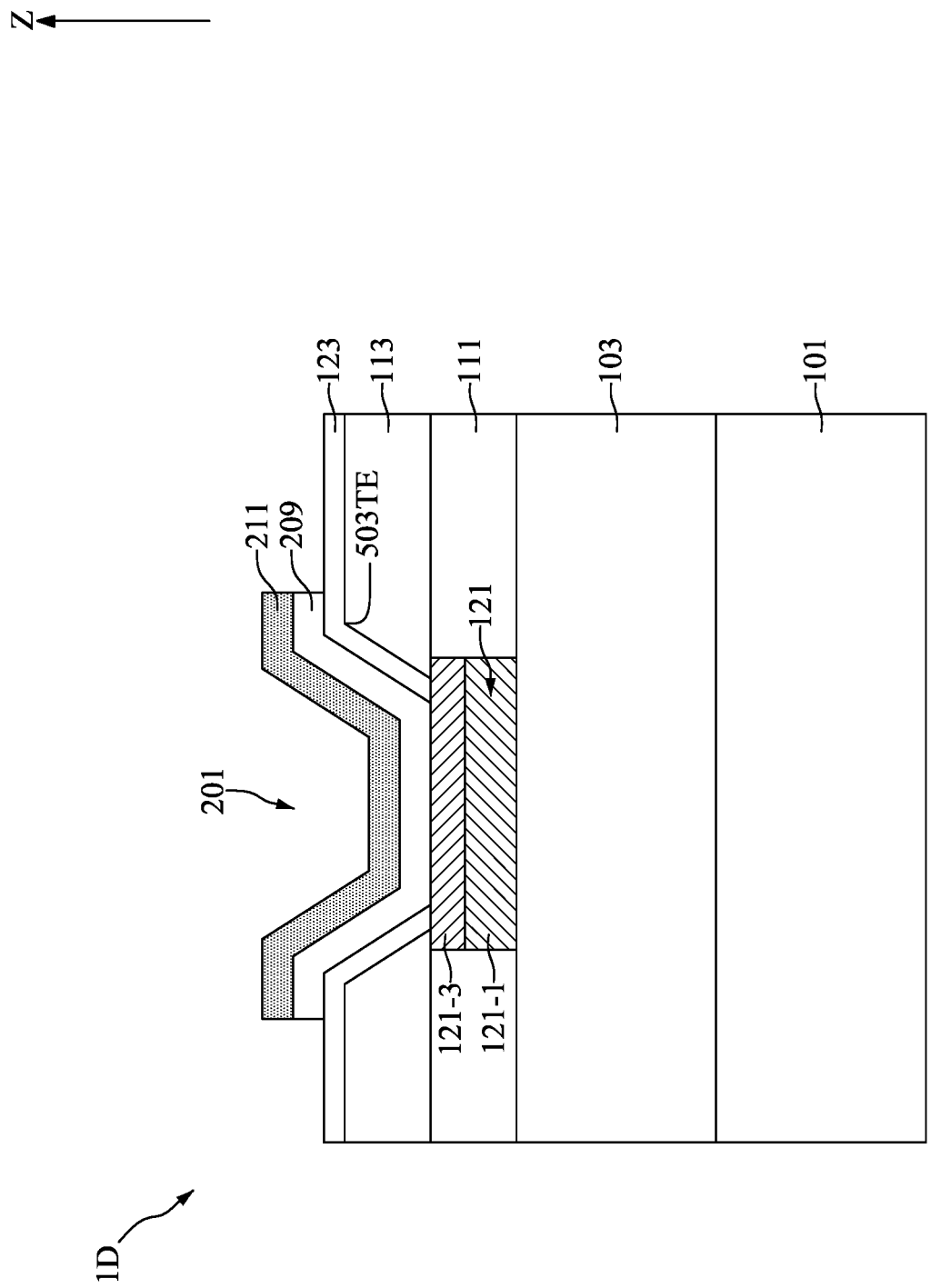

FIGS. 25 to 27 illustrate, in schematic cross-sectional view diagrams, semiconductor devices 1B, 1C, and 1D in accordance with some embodiments of the present disclosure.

With reference to FIG. 25, the semiconductor device 1B may have a structure similar to that illustrated in FIG. 19. The same or similar elements in FIG. 25 as in FIG. 19 have been marked with similar reference numbers and duplicative descriptions have been omitted.

With reference to FIG. 25, the first redistribution conductive layer 209 may include a seed layer 209-1 and a plating layer 209-3. The seed layer 209-1 may be disposed on the first pad 121. The plating layer 209-3 may be disposed on the seed layer 209-1. The plating layer 209-3 may be formed of, for example, tungsten, titanium, tin, nickel, copper, gold, aluminum, platinum, cobalt, or a combination thereof.

With reference to FIG. 26, the semiconductor device 1C may have a structure similar to that illustrated in FIG. 19. The same or similar elements in FIG. 26 as in FIG. 19 have been marked with similar reference numbers and duplicative descriptions have been omitted.

With reference to FIG. 26, the first redistribution structure 201 may include a barrier layer 213 and an adjustment layer 215. The barrier layer 213 may be disposed between the first redistribution conductive layer 209 and the first pad 121 and between the first redistribution conductive layer 209 and the insulating interface layer 123. The barrier layer 213 may have a thickness between about 10 angstroms and about 15 angstroms. In some embodiments, the first barrier layer 401 may have a thickness between about 11 angstroms and about 13 angstroms. The barrier layer 213 may be formed of, for example, titanium, titanium nitride, titanium silicon nitride, tantalum, tantalum nitride, tantalum silicon nitride, or a combination thereof. The barrier layer 213 may serve as an adhesive layer between the first pad 121 and the first redistribution conductive layer 209. The barrier layer 213 may also prevent metal ions of the first redistribution conductive layer 209 diffusing into the top passivation layer 113 or the insulating interface layer 123.

With reference to FIG. 26, the adjustment layer 215 may be disposed between the first redistribution conductive layer 209 and the barrier layer 213. In some embodiments, the adjustment layer 215 may be formed of, for example, a material including $sp^2$ hybridized carbon atoms. In some embodiments, the adjustment layer 215 may be formed of, for example, a material including carbons having hexagonal crystal structures. In some embodiments, the adjustment layer 215 may be formed of, for example, graphene, graphite, or the like. In some embodiments, the adjustment layer 215 may be formed of, for example, graphene. As the adjustment layer 215 formed of graphene has excellent electrical conductivity, the resistance between the first redistribution conductive layer 209 and the first pad 121 can be reduced. Therefore, the power consumption for the semiconductor device 1C may be decreased.

With reference to FIG. 27, the semiconductor device 1D may have a structure similar to that illustrated in FIG. 19. The same or similar elements in FIG. 27 as in FIG. 19 have been marked with similar reference numbers and duplicative descriptions have been omitted.

With reference to FIG. 27, the first pad 121 may include a bottom portion 121-1 and a top portion 121-3. The bottom portion 121-1 may be disposed on the interconnection layer 103. The top portion 121-3 may be disposed on the bottom portion 121-1. The bottom portion 121-1 may include nickel. The top portion 121-3 may include palladium, cobalt, or a combination thereof.

One aspect of the present disclosure provides a semiconductor device including a substrate, a first pad positioned above the substrate, and a first redistribution structure including a first redistribution conductive layer positioned on the first pad and a first redistribution thermal release layer positioned on the first redistribution conductive layer. The first redistribution thermal release layer is configured to sustain a thermal resistance between about 0.04° C. $cm^2$/Watt and about 0.25° C. $cm^2$/Watt.

Another aspect of the present disclosure provides a method for fabricating a semiconductor device including providing a substrate, forming a first pad above the substrate, forming a first redistribution conductive layer on the first pad, and forming a first redistribution thermal release layer on the first redistribution conductive layer. The first redistribution conductive layer and the first redistribution thermal release layer together form a first redistribution structure and the first redistribution thermal release layer is configured to sustain a thermal resistance between about 0.04° C. $cm^2$/Watt and about 0.25° C. $cm^2$/Watt.

Due to the design of the semiconductor device of the present disclosure, the first redistribution thermal release layer 211 and the second redistribution thermal release layer 311 may improve the thermal dissipation ability of the semiconductor device 1A. As a result, the performance and the reliability of the semiconductor device 1A may be improved. In addition, power consumption for the semiconductor device 1C may be decreased due to the presence of the adjustment layer 215.

It should be noted that the terms "forming," "formed" and "form" may mean and include any method of creating, building, patterning, implanting, or depositing an element, a dopant or a material. Examples of forming methods may include, but are not limited to, atomic layer deposition, chemical vapor deposition, physical vapor deposition, sputtering, co-sputtering, spin coating, diffusing, depositing, growing, implantation, photolithography, dry etching, and wet etching.

It should be noted that the functions or steps noted herein may occur in an order different from the order noted in the figures. For example, two figures shown in succession may in fact be executed substantially concurrently or may sometimes be executed in a reversed order, depending upon the functionalities or steps involved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A method for fabricating a semiconductor device, comprising:
   providing a substrate;
   forming a first pad above the substrate;
   forming a first redistribution conductive layer on the first pad; and
   forming a first redistribution thermal release layer on the first redistribution conductive layer;
   wherein the first redistribution conductive layer and the first redistribution thermal release layer together form a first redistribution structure and the first redistribution thermal release layer is configured to sustain a thermal resistance between about 0.04° C. cm$^2$/Watt and about 0.25° C. cm$^2$/Watt;
   wherein the first redistribution thermal release layer comprises an organic material interstitially mingled with carbon nanotubes;
   wherein the first redistribution conductive layer is formed of tungsten, titanium, tin, nickel, copper, gold, aluminum, platinum, cobalt, or a combination thereof;
   wherein forming the first pad comprises:
   forming a bottom passivation layer above the substrate;
   forming a pad opening along the bottom passivation layer; and
   forming the first pad in the pad opening.

2. The method for fabricating the semiconductor device of claim 1, wherein the first redistribution thermal release layer comprises an organic material interstitially mingled with carbon nanotubes.

3. The method for fabricating the semiconductor device of claim 1, wherein the first redistribution thermal release layer comprises a fluoropolymer material interstitially mingled with carbon nanotubes.

4. The method for fabricating the semiconductor device of claim 1, further comprising a step of performing a cleaning process and a passivation process to the pad opening before the step of forming the first pad in the pad opening, wherein a process temperature of the cleaning process is between about 250° C. and about 350° C.

5. The method for fabricating the semiconductor device of claim 4, wherein a precursor of the passivation process is dimethylaminotrimethylsilane or tetramethylsilane.

6. A method for fabricating a semiconductor device, comprising:
   providing a substrate;
   forming a first pad above the substrate;
   forming a first redistribution conductive layer on the first pad; and
   forming a first redistribution thermal release layer on the first redistribution conductive layer;
   wherein the first redistribution conductive layer and the first redistribution thermal release layer together form a first redistribution structure and the first redistribution thermal release layer is configured to sustain a thermal resistance between about 0.04° C. cm$^2$/Watt and about 0.25° C. cm$^2$/Watt;
   wherein the first redistribution thermal release layer comprises an organic material interstitially mingled with carbon nanotubes;
   wherein an aspect ratio of the carbon nanotubes is between about 1:1 and about 1:100.

7. The method for fabricating the semiconductor device of claim 6, wherein the first redistribution conductive layer comprises a seed layer on the first pad and a plating layer between the first redistribution thermal release layer and the seed layer.

8. The method for fabricating the semiconductor device of claim 6, further comprising: forming a barrier layer between the first pad and the first redistribution conductive layer.

9. The method for fabricating the semiconductor device of claim 8, wherein a thickness of the barrier layer is between about 10 angstroms and about 15 angstroms.

10. The method for fabricating the semiconductor device of claim 9, wherein the barrier layer is formed of titanium, titanium nitride, titanium silicon nitride, tantalum, tantalum nitride, tantalum silicon nitride, or a combination thereof.

11. The method for fabricating the semiconductor device of claim 10, further comprising: forming an adjustment layer between the barrier layer and the first redistribution conductive layer, wherein the adjustment layer is formed of a material including sp$^2$ hybridized carbon atoms.

12. The method for fabricating the semiconductor device of claim 11, wherein the adjustment layer is formed of graphene or graphite.

13. The method for fabricating the semiconductor device of claim 6, wherein forming the first pad comprises forming a bottom portion above the substrate and forming a top portion on the bottom portion, the bottom portion comprises nickel, and the top portion comprises palladium, cobalt, or a combination thereof.

14. The method for fabricating the semiconductor device of claim 6, further comprising: forming a second pad above the substrate and forming a second redistribution structure, wherein the second redistribution structure comprises a second redistribution conductive layer on the second pad and a second redistribution thermal release layer on the second redistribution conductive layer, and the second redistribution thermal release layer is configured to sustain a thermal resistance between about 0.04° C. cm$^2$/Watt and about 0.25° C. cm$^2$/Watt.

* * * * *